US012698555B2

(12) United States Patent
Kim et al.

(10) Patent No.: US 12,698,555 B2
(45) Date of Patent: Aug. 4, 2026

(54) METHOD AND DEVICE FOR MANUFACTURING DISPLAY APPARATUS

(71) Applicant: Samsung Display Co., LTD., Yongin-si (KR)

(72) Inventors: Jeongkuk Kim, Yongin-si (KR); Duckjung Lee, Yongin-si (KR); Jihyun Jung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/817,418

(22) Filed: Aug. 28, 2024

(65) Prior Publication Data

US 2025/0250662 A1     Aug. 7, 2025

(30) Foreign Application Priority Data

Feb. 5, 2024     (KR) ........................ 10-2024-0017624

(51) Int. Cl.
*C23C 14/04*          (2006.01)

(52) U.S. Cl.
CPC .................................. *C23C 14/042* (2013.01)

(58) Field of Classification Search
CPC ........ C23C 14/042; C23C 14/04; C23C 14/00
USPC ......... 394/1, 4; 460/20; 29/428; 252/299.01; 349/1, 4
See application file for complete search history.

(56) References Cited

U.S. PATENT DOCUMENTS

| | | | |
|---|---|---|---|
| 9,045,818 B2 | 6/2015 | Gersdorff et al. | |
| 10,072,328 B2 * | 9/2018 | Ghosh | ................... C23C 14/042 |
| 10,386,731 B2 * | 8/2019 | Ghosh | ..................... G03F 7/707 |
| 10,396,283 B2 * | 8/2019 | Takeda | ................... C23C 14/042 |
| 10,644,239 B2 * | 5/2020 | Ghosh | ................... C23C 14/042 |
| 10,651,386 B2 * | 5/2020 | Takeda | ................. C23C 14/042 |
| 10,873,029 B2 * | 12/2020 | Takeda | ................. H10K 71/166 |
| 10,876,199 B2 * | 12/2020 | Kishimoto | ............. H05B 33/10 |
| 11,038,009 B2 * | 6/2021 | Ju | ............................ C23C 14/24 |
| 11,275,315 B2 * | 3/2022 | Ghosh | ..................... G03F 7/707 |
| 11,877,500 B2 * | 1/2024 | Kim | ...................... C23C 14/042 |
| 12,266,535 B2 * | 4/2025 | Reddy | ................ H01L 21/0337 |

(Continued)

FOREIGN PATENT DOCUMENTS

| | | |
|---|---|---|
| KR | 1020110045217 A | 5/2011 |
| KR | 101673126 B1 | 11/2016 |
| KR | 1020220072864 A | 6/2022 |

*Primary Examiner* — Lawrence Averick

(74) *Attorney, Agent, or Firm* — CANTOR COLBURN LLP

(57)          ABSTRACT

A device for manufacturing a display apparatus includes a mask assembly, and a magnetic force portion facing the mask assembly, where the magnetic force portion applies a magnetic force toward the mask assembly. The mask assembly includes a mask frame, in which first openings are defined therethrough and a second opening is defined in a first surface thereof, where the second opening is arranged between two adjacent first openings among the first openings, a mask membrane disposed on a second surface of the mask frame opposite to the first surface and overlapping at least one of the first openings, and a support member on the first surface of the mask frame and including a magnetic body, where the support member is disposed on a surface of the mask frame defining a first opening or a surface of the mask frame defining the second opening.

10 Claims, 23 Drawing Sheets

(56) References Cited

U.S. PATENT DOCUMENTS

| | | | | |
|---|---|---|---|---|
| 2008/0268164 A1* | 10/2008 | Thayer | C23C 14/042 | |
| | | | | 427/595 |
| 2016/0141498 A1* | 5/2016 | Ghosh | C23C 14/042 | |
| | | | | 438/34 |
| 2018/0062079 A1* | 3/2018 | Ko | C23C 14/12 | |
| 2018/0190906 A1* | 7/2018 | Takeda | C23C 14/042 | |
| 2019/0319190 A1* | 10/2019 | Nakamura | B23K 26/21 | |
| 2019/0363256 A1* | 11/2019 | Takeda | C23C 14/042 | |
| 2020/0044010 A1* | 2/2020 | Ju | C23C 14/12 | |
| 2020/0235299 A1* | 7/2020 | Takeda | H10K 71/00 | |
| 2020/0263287 A1* | 8/2020 | Kishimoto | H10K 71/00 | |
| 2021/0098702 A1* | 4/2021 | Takeda | C23C 14/042 | |
| 2021/0273207 A1* | 9/2021 | Kishimoto | C23C 14/042 | |
| 2021/0391541 A1* | 12/2021 | Kim | H10K 71/166 | |
| 2022/0406610 A1* | 12/2022 | Reddy | H01L 21/02274 | |

* cited by examiner

METHOD AND DEVICE FOR MANUFACTURING DISPLAY APPARATUS

This application claims priority to Korean Patent Application No. 10-2024-0017624, filed on Feb. 5, 2024, and all the benefits accruing therefrom under 35 U.S.C. § 119, the content of which in its entirety is herein incorporated by reference.

BACKGROUND

1. Field

One or more embodiments relate to a method and device for manufacturing a display apparatus, in which the display apparatus may be a display apparatus including a light-emitting diode.

2. Description of the Related Art

Display apparatuses visually display data. Display apparatuses may provide an image by using light-emitting diodes. The use and structures of display apparatuses have diversified, structures capable of being bent to a certain angle from a flat state have also been developed, and various designs for improving the quality of display apparatuses have been attempted.

Display apparatuses may include a plurality of pixels arranged in a pattern to implement an image. In such display apparatuses, several layers including an emission layer may be included in the plurality of pixels arranged in the pattern. Such layers may be disposed on a substrate in different patterns depending on their types.

SUMMARY

Each layer of a display apparatus may be formed by depositing a deposition material by using a mask having openings corresponding to a pattern to be formed over a substrate. To deposit a deposition material in a more precise pattern, it is desired to bring the substrate and the mask into close contact with each other. In this regard, the substrate and the mask may be placed between a magnetic force portion capable of applying magnetic force and a metal support member, and the substrate and the mask may be pressed and brought into close contact with each other by applying magnetic force to the metal support member by using the magnetic force portion. However, in this case, various problems including a problem in which a deposition material accumulates on the metal support member may occur during the deposition process.

According to one or more embodiments, a device for manufacturing a display apparatus includes a mask assembly, and a magnetic force portion facing the mask assembly, where the magnetic force portion applies a magnetic force toward the mask assembly, where the mask assembly includes a mask frame in which a plurality of first openings is defined therethrough and a second opening is defined in a first surface thereof, where the second opening is arranged between two adjacent first openings among the plurality of first openings, a mask membrane disposed on a second surface of the mask frame, which is opposite to the first surface, and overlapping at least one of the plurality of first openings, and a support member disposed on the first surface of the mask frame and including a magnetic body, where the support member is disposed on at least one selected from a surface of the mask frame defining a first opening and a surface of the mask frame defining the second opening.

According to an embodiment, a depth of the second opening may be less than a thickness of the mask frame.

According to an embodiment, the support member may define a groove overlapping the second opening.

According to an embodiment, a width of the second opening may change in a depth direction of the second opening.

According to an embodiment, a width of the second opening may be about a half of a distance between the two adjacent first openings or greater.

According to an embodiment, the support member may completely fill in the second opening.

According to an embodiment, a third opening may be defined in the first surface of the mask frame, where the third opening may be arranged outside the plurality of first openings, and a portion of the support member may be arranged in the third opening.

According to an embodiment, the second opening may be provided in plural, and a plurality of second openings may be apart from each other and arranged between the two adjacent first openings among the plurality of first openings.

According to an embodiment, in a plan view, the second opening may at least partially surround one of the plurality of first openings.

According to an embodiment, a thickness of the support member may be about 10 angstroms or greater.

According to one or more embodiments, a method of manufacturing a display apparatus includes placing a workpiece between a magnetic force portion and a mask assembly in a device for manufacturing a display apparatus, and bringing the workpiece and the mask assembly into close contact with each other by applying magnetic force to the mask assembly via the magnetic force portion, where the mask assembly includes a mask frame in which a plurality of first openings is defined therethrough and a second opening is defined in a first surface thereof, where the second opening is arranged between two adjacent first openings among the plurality of first openings, a mask membrane disposed on a second surface of the mask frame, which is opposite to the first surface, and overlapping at least one of the plurality of first openings, and a support member disposed on the first surface of the mask frame and including a magnetic body, where the support member is disposed on at least one selected from a surface of the mask frame defining the first opening and a surface of the mask frame defining the second opening.

According to an embodiment, a depth of the second opening may be less than a thickness of the mask frame.

According to an embodiment, the support member may define a groove overlapping the second opening.

According to an embodiment, a width of the second opening may change in a depth direction of the second opening.

According to an embodiment, a width of the second opening may be about a half of a distance between the two adjacent first openings or greater.

According to an embodiment, the support member may completely fill in the second opening.

According to an embodiment, a third opening may be defined in the first surface of the mask frame, where the third opening may be arranged outside the plurality of first openings, and a portion of the support member may be arranged in the third opening.

According to an embodiment, the second opening may be provided in plural, where a plurality of second openings may be apart from each other and arranged between the two adjacent first openings among the plurality of first openings.

According to an embodiment, in a plan view, the second opening may at least partially surround one of the plurality of first openings.

According to an embodiment, a thickness of the support member may be about 10 angstroms or greater.

BRIEF DESCRIPTION OF THE DRAWINGS

The above and other features of certain embodiments of the disclosure will be more apparent from the following description taken in conjunction with the accompanying drawings, in which:

FIG. 5 is a bottom view of a mask assembly according to an embodiment;

DETAILED DESCRIPTION

Figure 1A:
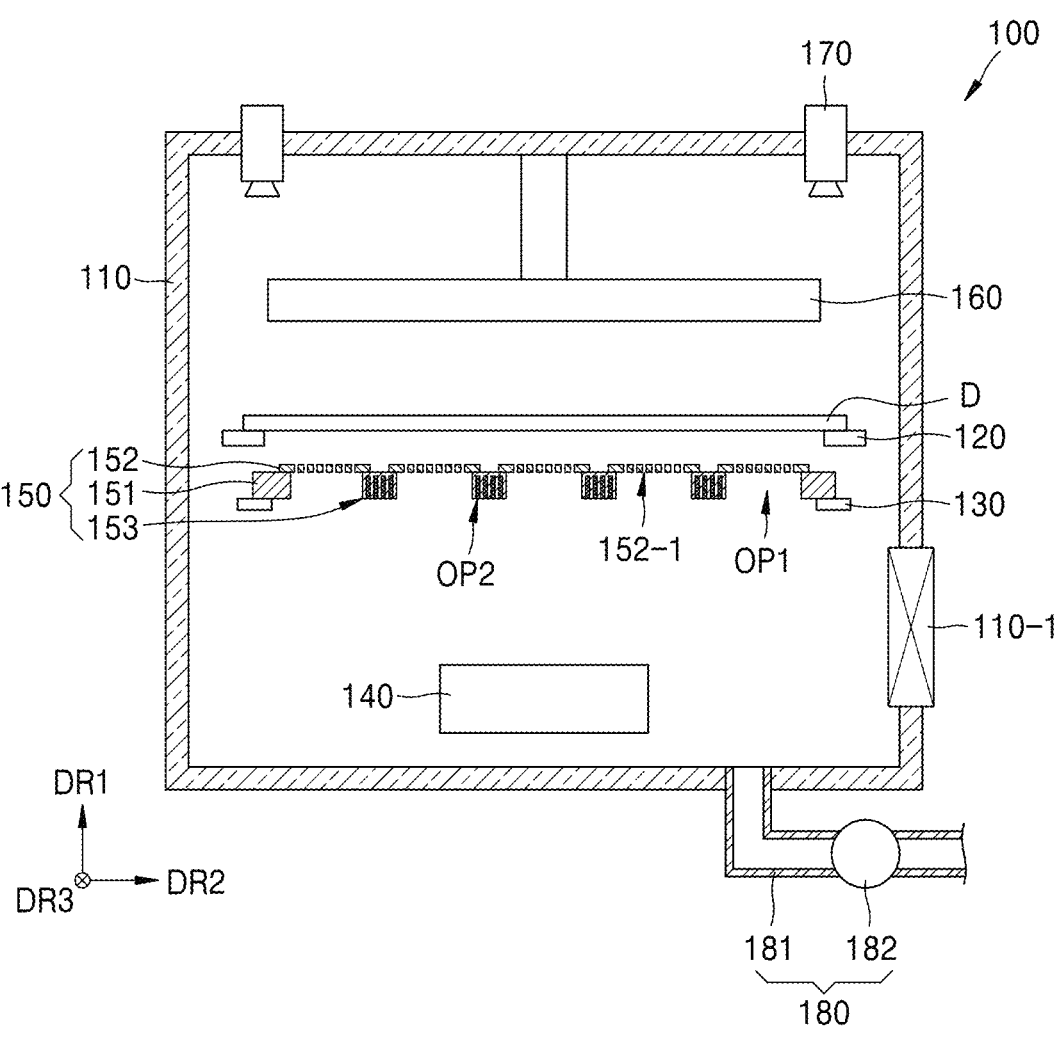
FIGS. 1A and 1B are cross-sectional views of a device for manufacturing a display apparatus, according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

One or more embodiments will be described below in more detail with reference to the accompanying drawings. Those elements that are the same or are in correspondence with each other are rendered the same reference numeral regardless of the figure number, and any repetitive detailed descriptions thereof may be omitted or simplified.

will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. Thus, reference to "an" element in a claim followed by reference to "the" element is inclusive of one element and a plurality of the elements. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items Throughout the disclosure, the expression "at least one of a, b or c" or "at least one selected from a, b and c" indicates only a, only b, only c, both a and b, both a and c, both b and c, all of a, b, and c, or variations thereof.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be further understood that, when a layer, region, or element is referred to as being on, over, under, or below another layer, region, or element, it may be directly or indirectly on or under the other layer, region, or element. That is, for example, intervening layers, regions, or elements may be present.

Sizes of elements in the drawings may be exaggerated or reduced for convenience of explanation. For example, since sizes and thicknesses of elements in the drawings are arbitrarily illustrated for convenience of description, the following embodiments are not limited thereto.

A first direction DR1, a second direction DR2, and a third direction DR3 are not limited to three directions of the rectangular coordinate system and may be interpreted in a broader sense. For example, the first direction DR1, the second direction DR2, and the third direction DR3 may be perpendicular to one another or may represent different directions that are not perpendicular to one another.

When an embodiment may be implemented differently, a certain process order may be performed differently from the described order. For example, two consecutively described processes may be performed substantially at the same time or performed in an order opposite to the described order.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 1B:
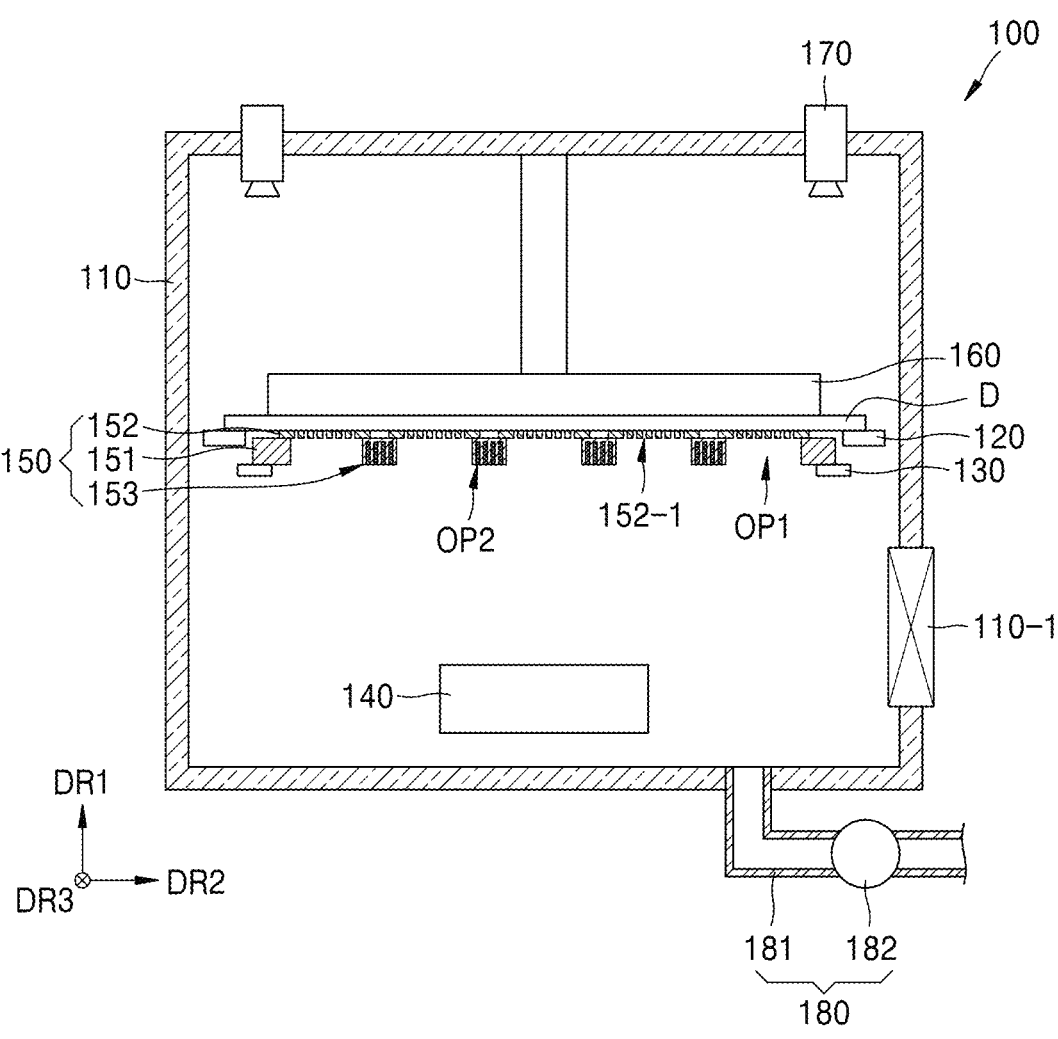

FIGS. 1A and 1B are cross-sectional views of a device 100 for manufacturing a display apparatus, according to an embodiment.

Referring to FIGS. 1A and 1B, an embodiment of the device 100 for manufacturing a display apparatus may include a chamber 110, a first support 120, a second support 130, a deposition source 140, a mask assembly 150, a magnetic force portion 160, a vision portion 170, and a pressure controller 180. FIG. 1A shows an embodiment in a state where the mask assembly 150, a workpiece D, and the magnetic force portion 160 are apart from one another. FIG. 1B shows an embodiment in a state where the mask assembly 150, the workpiece D, and the magnetic force portion 160 are close to one another and are in close contact with one another. In the disclosure, the workpiece D may refer to an object to be processed by a device for manufacturing a display apparatus and may also refer to a display substrate D (refer to FIG. 15) of a display apparatus. Hereinafter, for convenience of description, the term "workpiece D" will be used to describe the device 100, and the term "display substrate D" will be used to describe a display apparatus 20 (refer to FIG. 14), but both may refer to the same object.

The chamber 110 may include a space defined therein, and a portion thereof may be open. A gate valve 110-1 may be installed in the open portion of the chamber 110. In an embodiment, the open portion of the chamber 110 may be opened or closed based on an operation of the gate valve 110-1.

The first support 120 may be disposed in the chamber 110. The first support 120 may allow the workpiece D to be seated thereon to support the workpiece D. In an embodiment, the first support 120 may be in the form of a frame fixed inside the chamber 110. In another embodiment, the first support 120 may be in the form of a shuttle linearly moveable in the chamber 110. In another embodiment, the first support 120 may include an electrostatic chuck or adhesive chuck arranged in the chamber 110 to be fixed to the chamber 110 or be capable of being raised or lowered in the chamber 110. Hereinafter, embodiments where the first support 120 is in the form of a frame fixed inside the chamber 110 will be mainly described for convenience of description.

The mask assembly 150 may be disposed in the chamber 110. The mask assembly 150 may be seated on the second support 130. In this case, the second support 130 may be arranged inside the chamber 110. The second support 130 may fine-adjust a position of the mask assembly 150. In an embodiment, the second support 130 may include a separate driver or alignment unit for moving the mask assembly 150 in different directions. In another embodiment, the second support 130 may be in the form of a shuttle. In such an embodiment, the second support 130 may allow the mask assembly 150 to be seated thereon and may be capable of transporting the mask assembly 150. In an embodiment, for example, the second support 130 may move out of the chamber 110 to have the mask assembly 150 seated thereon and then may enter the chamber 110 from outside the chamber 110.

In an embodiment, the first support 120 and the second support 130 may be integrally formed with each other as a single unitary indivisible part. In such an embodiment, the first support 120 and the second support 130 may include a movable shuttle. In such an embodiment, the first support 120 and the second support 130 may include a structure in which the mask assembly 150 and the workpiece D are fixed to each other such that the workpiece D is seated on the mask assembly 150, and may linearly move the workpiece D and the mask assembly 150 simultaneously.

Hereinafter, embodiments having a form in which the first support 120 and the second support 130 are distinct from each other and arranged at different positions and a form in which the first support 120 and the second support 130 are arranged inside the chamber 110 will be mainly described for convenience of description.

The deposition source 140 may be disposed in the chamber 110 to face the mask assembly 150. In tan embodiment, a deposition material may be accommodated in the deposition source 140, and the deposition material may be evaporated or sublimated by heating the deposition material. The deposition source 140 may be fixed inside the chamber 110 or may be arranged inside the chamber 110 to be linearly moveable in one direction. Hereinafter, embodiments where the deposition source 140 is fixed inside the chamber 110 will be mainly described for convenience of description.

The mask assembly 150 may include a mask frame 151, a mask membrane 152, and a support member 153. The mask frame 151 may be provided with a first opening OP1 overlapping the mask membrane 152, that is, the first opening OP1 may be defined or formed through the mask frame 151 to overlap the mask membrane 152. The mask frame 151 may also be provided a second opening OP2 arranged between two first openings OP1 adjacent to each other. The mask membrane 152 may be provided with a plurality of holes 152-H defining a deposition area of the mask assembly 150. At least a portion (e.g., all) of the support member 153 may be arranged in the second opening OP2.

The magnetic force portion 160 may be disposed in the chamber 110 to face the workpiece D. In an embodiment, the magnetic force portion 160 may apply magnetic force to the support member 153, thereby pressing the mask assembly 150 toward the workpiece D. In such an embodiment, the magnetic force portion 160 may effectively prevent the mask membrane 152 from sagging down and may also bring the mask membrane 152 into close contact with the workpiece D. In addition, the magnetic force portion 160 may maintain a uniform distance between the mask membrane 152 and the workpiece D in a length direction of the mask membrane 152 (e.g., the second direction DR2 or the third direction DR3).

The vision portion 170 may be installed at the chamber 110 and may capture images of positions of the workpiece D and the mask assembly 150. In an embodiment, the vision portion 170 may include a camera for capturing images of the workpiece D and the mask assembly 150. Positions of the workpiece D and the mask assembly 150 may be identified based on the images captured by the vision portion 170, and based on the images, the first support 120 may fine-adjust the position of the workpiece D, or the second support 130 may fine-adjust the position of the mask assembly 150. Hereinafter, embodiments where the second support 130 finely adjusts a position of the mask assembly 150 to align positions of the workpiece D and the mask assembly 150 with each other will be mainly described for convenience of description.

The pressure controller 180 may be connected to the chamber 110 to control the internal pressure of the chamber 110. In an embodiment, for example, the pressure controller 180 may adjust the internal pressure of the chamber 110 to a level that is the same as or similar to that of atmospheric pressure. In addition, the pressure controller 180 may adjust the internal pressure of the chamber 110 to a level that is the same as or similar to that of a vacuum state.

The pressure controller 180 may include a connection pipe 181 connected to the chamber 110 and a pump 182 installed at the connection pipe 181. In such an embodiment, depending on an operation of the pump 182, external air may flow in through the connection pipe 181, or gas inside the chamber 110 may be guided to the outside through the connection pipe 181.

Such a device 100 may be used to manufacture a display apparatus described below. In an embodiment, when the pressure controller 180 adjusts the internal pressure of the chamber 110 to a level that is the same as or similar to that of atmospheric pressure, the gate valve 110-1 may operate to open the open portion of the chamber 110.

Subsequently, the workpiece D may be loaded into the chamber 110 from outside the chamber 110. In this process, the workpiece D may be loaded into the chamber 110 in various ways. In an embodiment, for example, the workpiece D may be loaded into the chamber 110 from outside the chamber 110 through a robot arm, etc., arranged outside the chamber 110. In another embodiment, where the first support 120 is in the form of a shuttle, after the first support 120 is carried out of the chamber 110 from inside the chamber 110, the workpiece D may be seated on the first support 120 through a separate robot arm, etc., arranged outside the chamber 110, and the first support 120 may be loaded into the chamber 110 from outside the chamber 110. Hereinafter, embodiments where the workpiece D is loaded into the chamber 110 from outside the chamber 110 through a robot arm arranged outside the chamber 110 will be mainly described for convenience of description.

In an embodiment, as described above, the mask assembly 150 may be arranged inside the chamber 110. In another embodiment, in the same or similar manner as the workpiece D, the mask assembly 150 may be loaded into the chamber 110 from outside the chamber 110. Hereinafter, embodiments where only the workpiece D is loaded into the chamber 110 from outside the chamber 110 with the mask assembly 150 arranged inside the chamber 110 will be mainly described for convenience of description.

In another embodiment, the first support 120 and the second support 130 may be in the form of a shuttle, and the workpiece D and the mask assembly 150 may be fixed thereon and then may be loaded into the chamber 110 from outside the chamber 110.

When the workpiece D is loaded into the chamber 110, the workpiece D may be seated on the first support 120. In an embodiment, the vision portion 170 may capture images of positions of the workpiece D and the mask assembly 150. In such an embodiment, the vision portion 170 may capture images of a first alignment mark of the workpiece D and a second alignment mark of the mask assembly 150.

Based on the captured images of the first alignment mark and the second alignment mark, positions of the workpiece D and the mask assembly 150 may be identified. In an embodiment, the device 100 may include a separate controller to identify positions of the workpiece D and the mask assembly 150. Once positions of the workpiece D and the mask assembly 150 are identified, the second support 130 may finely adjust the position of the mask assembly 150.

Subsequently, the deposition source 140 may operate to spray a deposition material toward the mask assembly 150 (e.g., in the first direction DR1), and the deposition material passing through a plurality of holes 152-1 in the mask membrane 152 may be deposited on the workpiece D. In an embodiment, the pump 182 may suck in gas inside the chamber 110 and discharge the gas to the outside, thereby maintaining the internal pressure of the chamber 110 at a level that is the same as or similar to that of a vacuum state.

The deposition material may pass through the holes 152-1 in the mask membrane 152 and be deposited on the workpiece D. The holes 152-1 in the mask membrane 152 may correspond to a designed deposition area of the workpiece D and thus may provide a deposition area that is the same as or similar to the designed deposition area.

In an embodiment, the above operation may be repeatedly performed on a plurality of workpieces D. In such an embodiment, when the number of depositions on the plurality of workpieces D becomes the same as a preset number of depositions, the device 100 may stop operating, and the mask assembly 150 may be drawn out of the chamber 110. Subsequently, a new mask assembly 150 may be loaded into the chamber 110 to repeat the above operation.

Through the above process, the device 100 may allow the deposition of a deposition material on an area that is the same as or similar to a shape designed on the workpiece D. In addition, the device 100 may allow the deposition of a deposition material in a precise pattern and thus may allow the manufacture of a display apparatus capable of precise image implementation.

Figure 2:
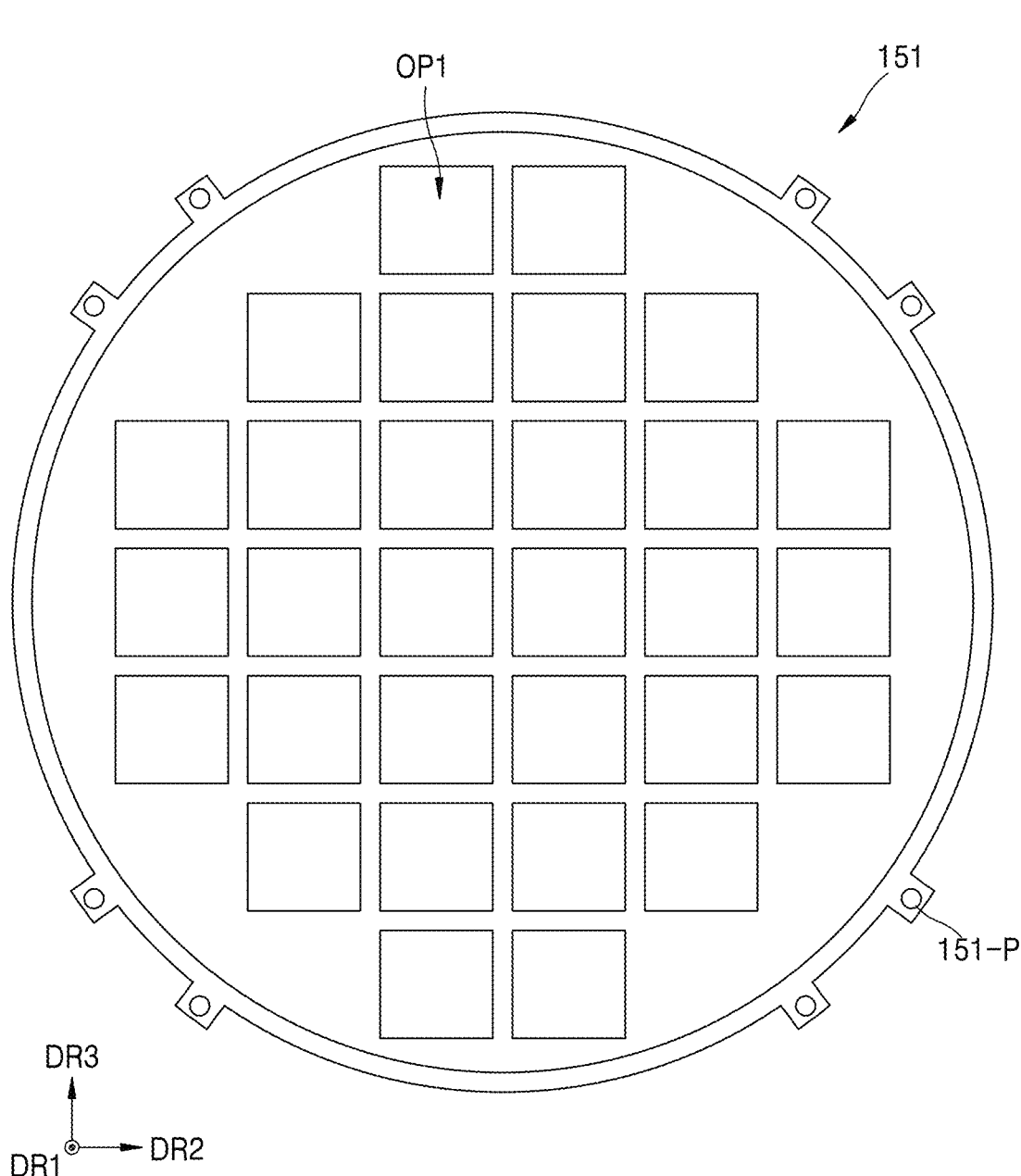
FIG. 2 is a plan view of a mask frame according to an embodiment.

FIG. 2 is a plan view of the mask frame 151 according to an embodiment.

Referring to FIG. 2, an embodiment of the mask frame 151 be provided a plurality of first openings OP1 through which the above-described deposition material may pass. The first openings OP1 may be apart from each other in a plan view or when viewed in the first direction DR1. The first openings OP1 may be arranged side by side in one direction. In an embodiment, for example, the first openings OP1 may be arranged side by side in the second direction DR2 or the third direction DR3.

The mask frame 151 may include a protrusion 151-P arranged on the periphery thereof. The protrusion 151-P of the mask frame 151 may be provided in plural, and a plurality of protrusions 151-P may be arranged along a perimeter of the mask frame 151. In an embodiment, the protrusion 151-P may be symmetrically arranged with respect to a center of the mask frame 151. In an embodiment, the protrusions 151-P may be arranged in pairs. In an embodiment, the protrusions 151-P may have a substantially quadrangular shape and may include an opening. In an embodiment, the protrusions 151-P may be in contact with or be coupled to the second support 130 (refer to FIG. 1A) described above and thus may be supported by the second support 130 (refer to FIG. 1A).

Although FIG. 2 shows an embodiment where the mask frame 151 has a substantially circular shape, one or more embodiments are not limited thereto. The mask frame 151 may have various shapes such as a polygonal shape, an oval shape, or an atypical shape. In addition, although FIG. 2 shows an embodiment where each of the first openings OP1 has a substantially square shape, one or more embodiments are not limited thereto. Similar to the mask frame 151, the first openings OP1 may have various shapes such as a polygonal shape, an oval shape, or an atypical shape, and a shape and/or size of each first opening OP1 may be different from each other. Hereinafter, embodiments where the mask frame 151 has an overall circular shape and the first openings OP1 each have a square shape of the same size will be mainly described for convenience of description.

Figure 3A:
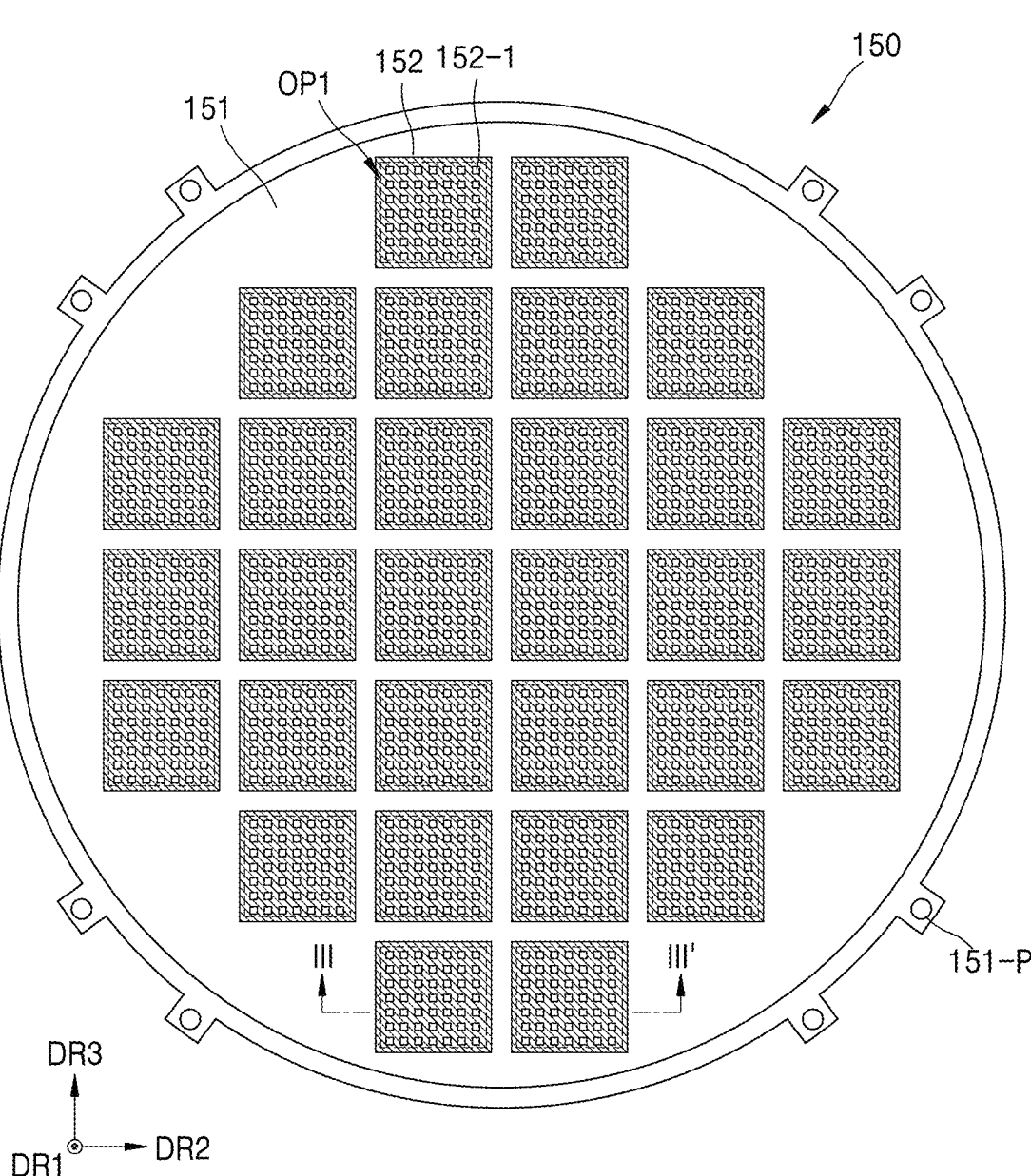
FIG. 3A is a plan view of a mask assembly according to an embodiment.
Figure 3B:
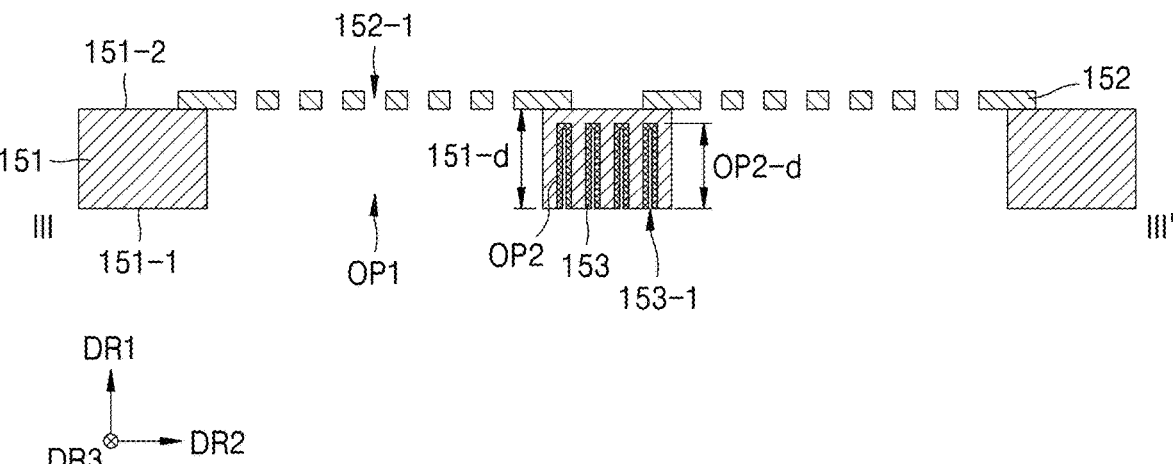
FIG. 3B is a cross-sectional view of the mask assembly, taken along line III-III' of FIG. 3A.
Figure 3C:
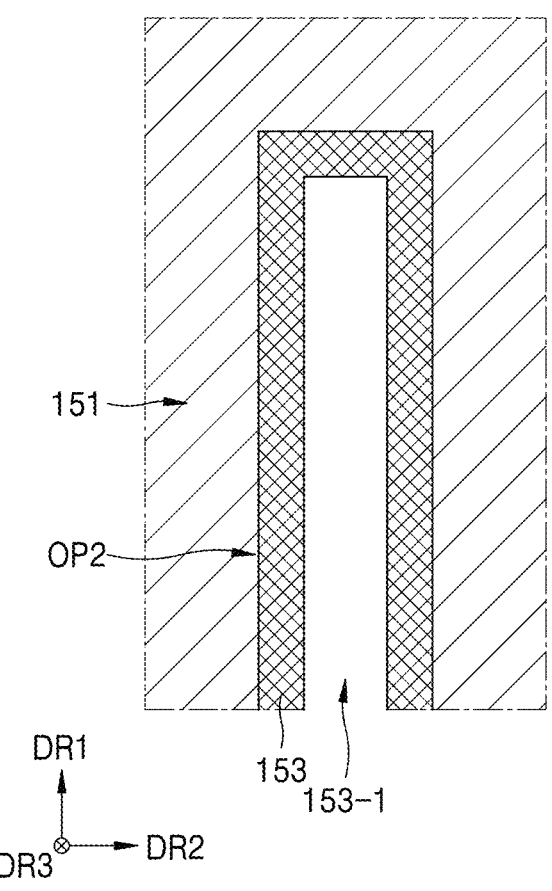
FIG. 3C is an enlarged cross-sectional view of the mask assembly, showing a partial region of FIG. 3B.

FIG. 3A is a plan view of the mask assembly 150 according to an embodiment. FIG. 3B is a cross-sectional view of the mask assembly 150, taken along line III-III' of FIG. 3A. FIG. 3C is an enlarged cross-sectional view of the mask assembly 150, showing a partial region of FIG. 3B.

Referring to FIGS. 3A to 3C, hereinafter, one surface of the mask frame 151 facing a direction opposite to the first direction DR1 will be referred to as a first surface 151-1 of the mask frame 151, and another surface of the mask frame 151 facing the first direction DR1 will be referred to as a second surface 151-2 of the mask frame 151. Accordingly, being disposed on the first surface 151-1 of the mask frame 151 may be understood as being disposed on the first surface 151-1 of the mask frame 151 to face the direction opposite to the first direction DR1. Similarly, being disposed on the second surface 151-2 of the mask frame 151 may be understood as being disposed on the second surface 151-2 of the mask frame 151 to face the first direction DR1.

The mask membrane 152 may be disposed on the second surface 151-2 of the mask frame 151. In an embodiment, as shown in FIG. 3A, the mask membrane 152 may be provided in plural, and a plurality of mask membranes 152 may overlap the first openings OP1, respectively. In an embodiment, each mask membrane 152 may be apart from another. In an embodiment, a shape of a mask membrane 152 may be similar to that of a corresponding first opening OP1, and a size of a mask membrane 152 may be greater than that of a corresponding first opening OP1. In an embodiment, for example, the first opening OP1 and the mask membrane 152 may have a substantially square shape, and a size of the mask membrane 152 may be greater than that of the first opening OP1. Accordingly, the mask membrane 152 may entirely cover the first opening OP1. As described above, similar to the shape and size of the first opening OP1, a shape and size of each mask membrane 152 may also be variously changed.

The mask membrane 152 may be provided with the holes 152-1 overlapping the first opening OP1. In an embodiment, one mask membrane 152 may include a plurality of holes 152-1, and the plurality of holes 152-1 may overlap one first opening OP1.

As shown in FIG. 3B, the first openings OP1 in the mask frame 151 may be defined or formed through the mask frame 151. Similarly, the holes 152-1 in the mask membrane 152 may be defined or formed through the mask membrane 152. When the above-described deposition material is sprayed, the deposition material may pass through the mask frame 151 and the mask membrane 152 through the first opening OP1 and the holes 152-1. Accordingly, the holes 152-1 in the mask membrane 152 may define the above-described deposition area.

In an embodiment, as shown in FIG. 3B, the holes 152-1 in the mask membrane 152 may have a constant width (or length in the second direction DR2) in the first direction DR1, but one or more embodiments are not limited thereto. In another embodiment, a width (or a length in the second direction DR2) of the holes 152-1 in the mask membrane 152 may change in the first direction DR1. In other words, unlike that shown in FIG. 3B, a surface of the mask membrane 152 defining each hole 152-1 may not be parallel to the first direction DR1.

In an embodiment, as shown in FIG. 3B, the first opening OP1 in the mask frame 151 may have a constant width (or length in the second direction DR2), but one or more embodiments are not limited thereto. In another embodiment, a width (or a length in the second direction DR2) of the first openings OP1 in the mask frame 151 may change in the first direction DR1. In other words, unlike that shown in FIG. 3B, a surface of the mask frame 151 defining each first opening OP1 may not be parallel to the first direction DR1.

Second openings OP2 in the mask frame 151 may be arranged in the first surface 151-1 of the mask frame 151. In an embodiment, the second openings OP2 may be arranged between two first openings OP1 adjacent to each other. In an embodiment, for example, the second opening OP2 may not be arranged outside outermost first openings OP1 among the first openings OP1 shown in FIG. 3A. In an embodiment, for example, the second opening OP2 may not be arranged at a second direction DR2 side of the first opening OP1 farthest out in the second direction DR2 among the first openings OP1 having a same position in terms of the third direction DR3, that is, arranged in a row in the second direction DR2. Alternatively, the second opening OP2 may not be arranged at a third direction DR3 side of the first opening OP1 farthest out in the third direction DR3 among the first openings OP1 having the same position in terms of the second direction DR2, that is, arranged in a row in the third direction DR3. Such a feature may be seen in FIG. 3B, which is a cross-sectional view taken along line III-III'. For example, referring to FIG. 3B, it may be seen that the second opening OP2 is not arranged to each of the left (or a side opposite to the second direction DR2) of the first opening OP1 located on the left side (or the side opposite to the second direction DR2) and the right (or a side to the second direction DR2)

of the first opening OP1 located on the right side (or the side to the second direction DR2).

In an embodiment, the second openings OP2 may be defined or formed in the mask frame 101 in a recess or groove form. The second openings OP2 may not be defined or formed completely through the mask frame 151. In other words, a depth OP2-*d* (or a length in the first direction DR1) of each of the second openings OP2 may be less than a thickness 151-*d* (or a length in the first direction DR1) of the mask frame 151. In an embodiment, the depth OP2-*d* of each second opening OP2 may be the same as each other.

Although FIG. 3B shows a total of four second openings OP2 arranged between the two first openings OP1 adjacent to each other, one or more embodiments are not limited thereto. In another embodiment, N (where N is a natural number, N≠4) second openings OP2 may be arranged between the two first openings OP1 adjacent to each other.

In an embodiment, the mask frame 151 and the mask membrane 152 may include silicon. In an embodiment, for example, the mask membrane 152 may include silicon oxide (SiO$_x$), silicon nitride (SiN$_x$), or silicon oxynitride (SiON), and the mask frame 151 may include silicone polymer.

In an embodiment, as shown in FIG. 3C, the support member 153 may be disposed on the first surface 151-1 of the mask frame 151, and at least a portion thereof may be arranged in the second opening OP2. In an embodiment, a portion of the mask frame 151 may be open in the direction opposite to the first direction DR1 through the second opening OP2, and the support member 153 may be received in the second opening OP2. Because the second openings OP2 may be between first openings OP1 adjacent to each other, at least a portion of the support member 153 may be between the first openings OP1 adjacent to each other. In an embodiment, the support member 153 may be arranged along an inner surface of the mask frame 151 that defines the second opening OP2. In an embodiment, the support member 153 may cover at least a portion (e.g., all) of an inner surface of the mask frame 151 that defines the second opening OP2. In an embodiment, the support member 153 may not completely fill in the second opening OP2. In an embodiment, the support member 153 may include a groove 153-1 overlapping the second opening OP2. In an embodiment, one surface (e.g., a surface facing the direction opposite to the first direction DR1) of the support member 153 may be on the same plane as the first surface 151-1 of the mask frame 151. In an embodiment, the support member 153 may include a magnetic body. In an embodiment, the support member 153 may include a metal.

Figure 4A:
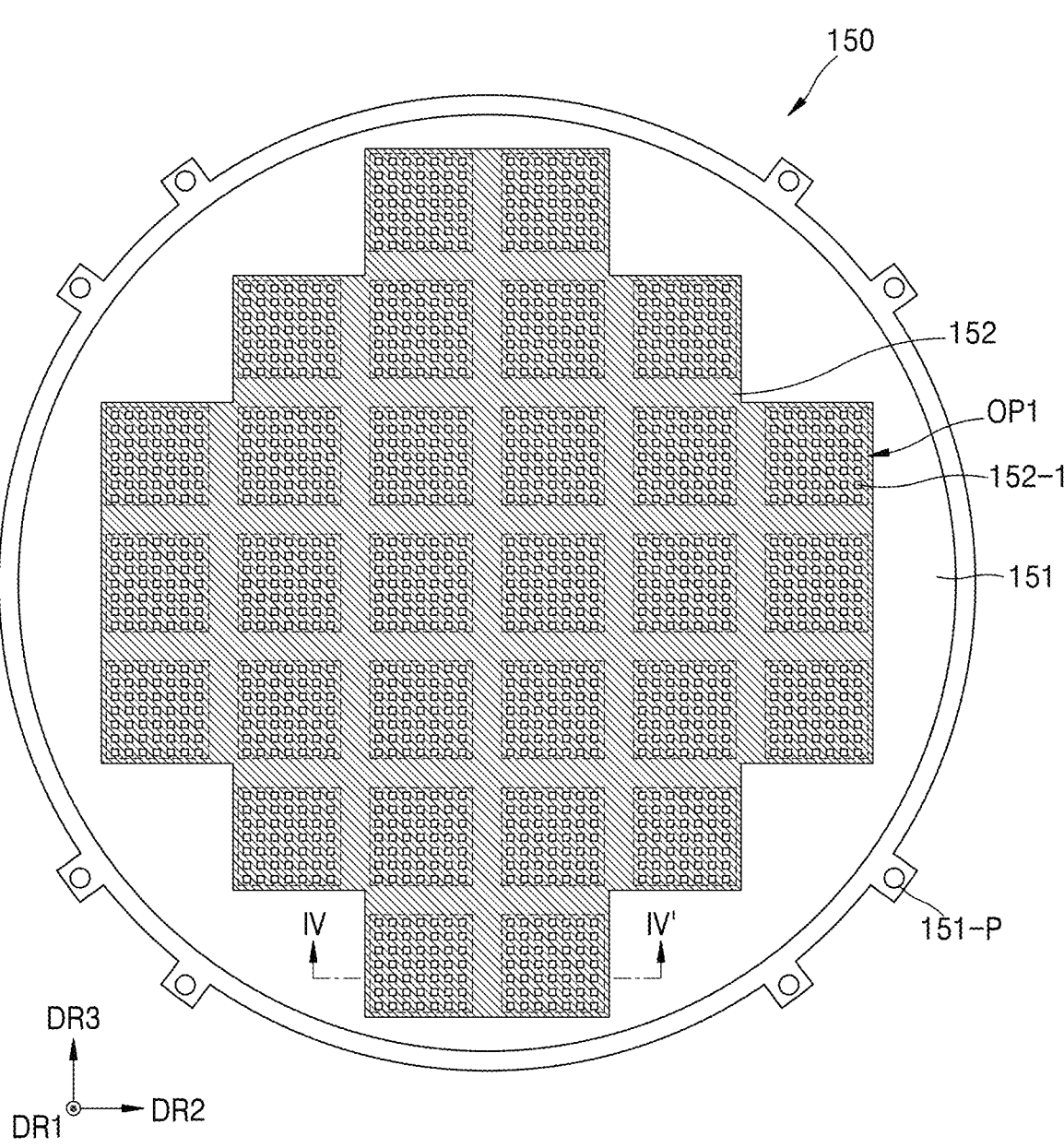
FIG. 4A is a plan view of a mask assembly according to an embodiment.
Figure 4B:
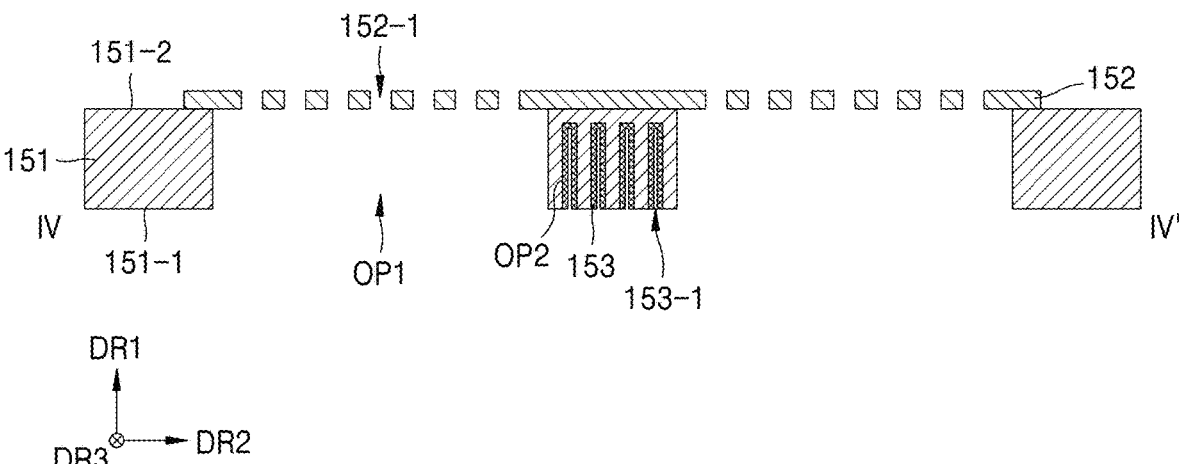
FIG. 4B is a cross-sectional view of the mask assembly, taken along line IV-IV' of FIG. 4A.

FIG. 4A is a plan view of the mask assembly 150 according to an embodiment. FIG. 4B is a cross-sectional view of the mask assembly 150, taken along line IV-IV' of FIG. 4A.

Hereinafter, for convenience of description, any repetitive detailed descriptions of features of the embodiment shown in FIGS. 4A and 4B that are the same as those described with reference to FIGS. 3A and 3B will be omitted, and differences will be mainly described.

Referring to FIGS. 4A and 4B, the mask membrane 152 may be integrally formed as a single unitary indivisible part and disposed on the second surface 151-2 of the mask frame 151. Accordingly, one mask membrane 152 may overlap a plurality of first openings OP1. In an embodiment, the mask membrane 152 may overlap all of the first openings OP1 in the mask frame 151. In an embodiment, an area between first openings OP1 adjacent to each other may be completely covered by the mask membrane 152. In an embodiment, as shown in FIG. 4A, an outline of the mask membrane 152 may be shaped similar to an outline of the first openings OP1 in a plan view. In another embodiment, an outline of the mask membrane 152 may be shaped similar to a shape of the mask frame 151 in a plan view. For example, in another embodiment, the mask membrane 152 in a plan view may have a substantially circular shape with a diameter less than that of the mask frame 151.

In an embodiment, as shown in FIG. 4B, the mask membrane 152 may overlap each of the second openings OP2 and support members 153 arranged in the second openings OP2. In an embodiment, the mask membrane 152 may overlap all of the second openings OP2 and the support members 153 arranged in the second openings OP2.

Figure 5:
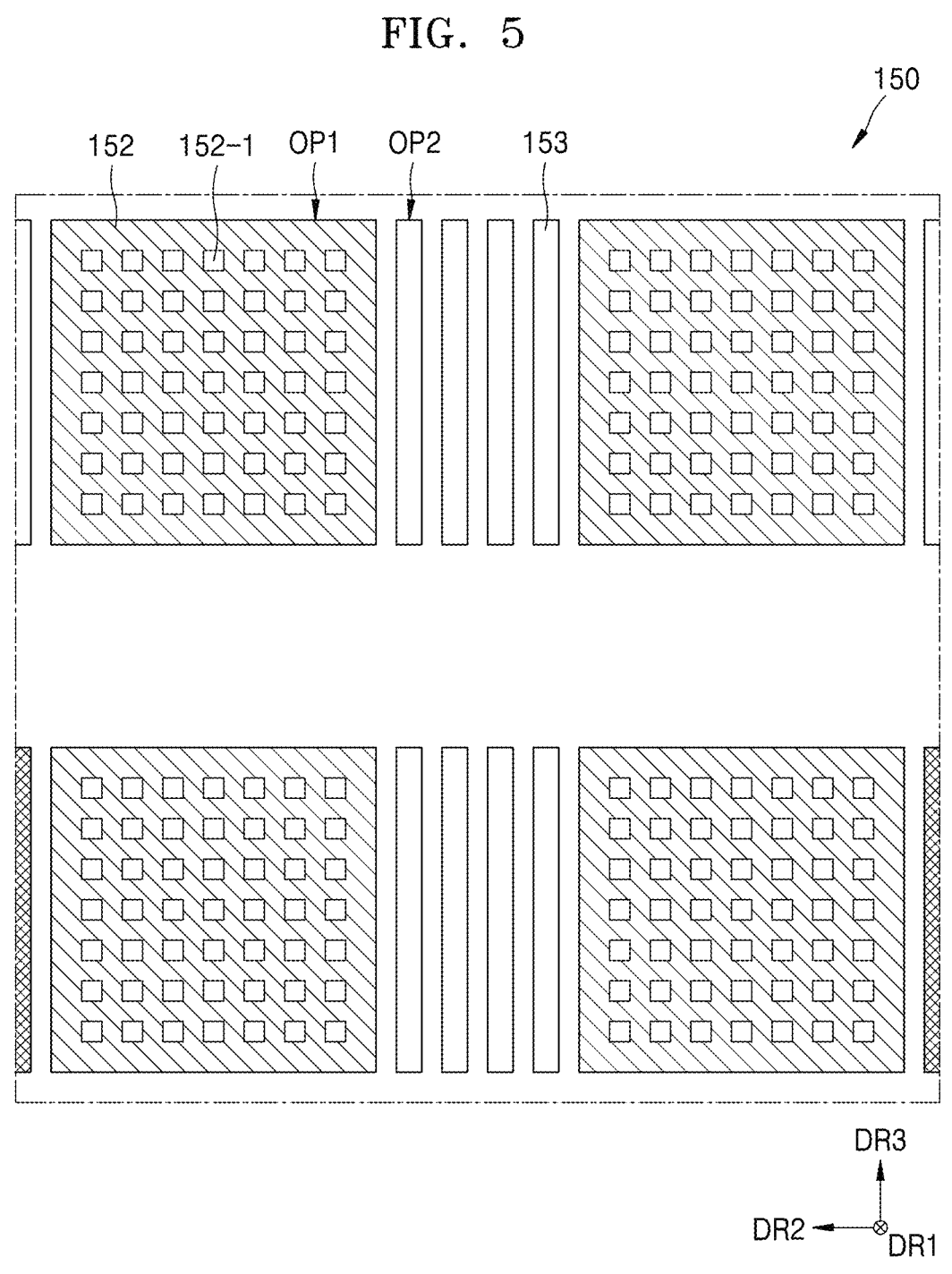
Figure 6:
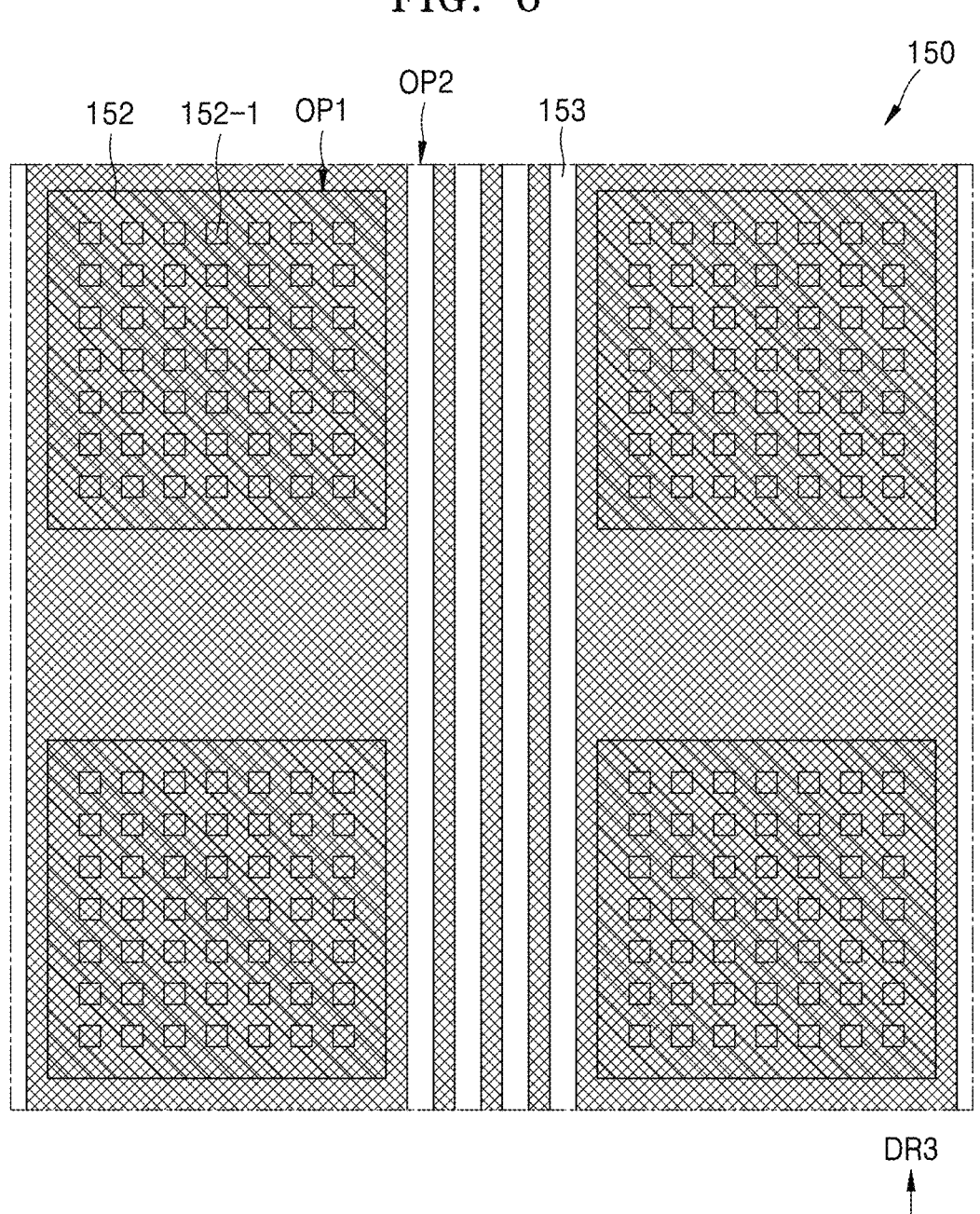
FIG. 6 is a bottom view of a mask assembly according to another embodiment.
Figure 7:
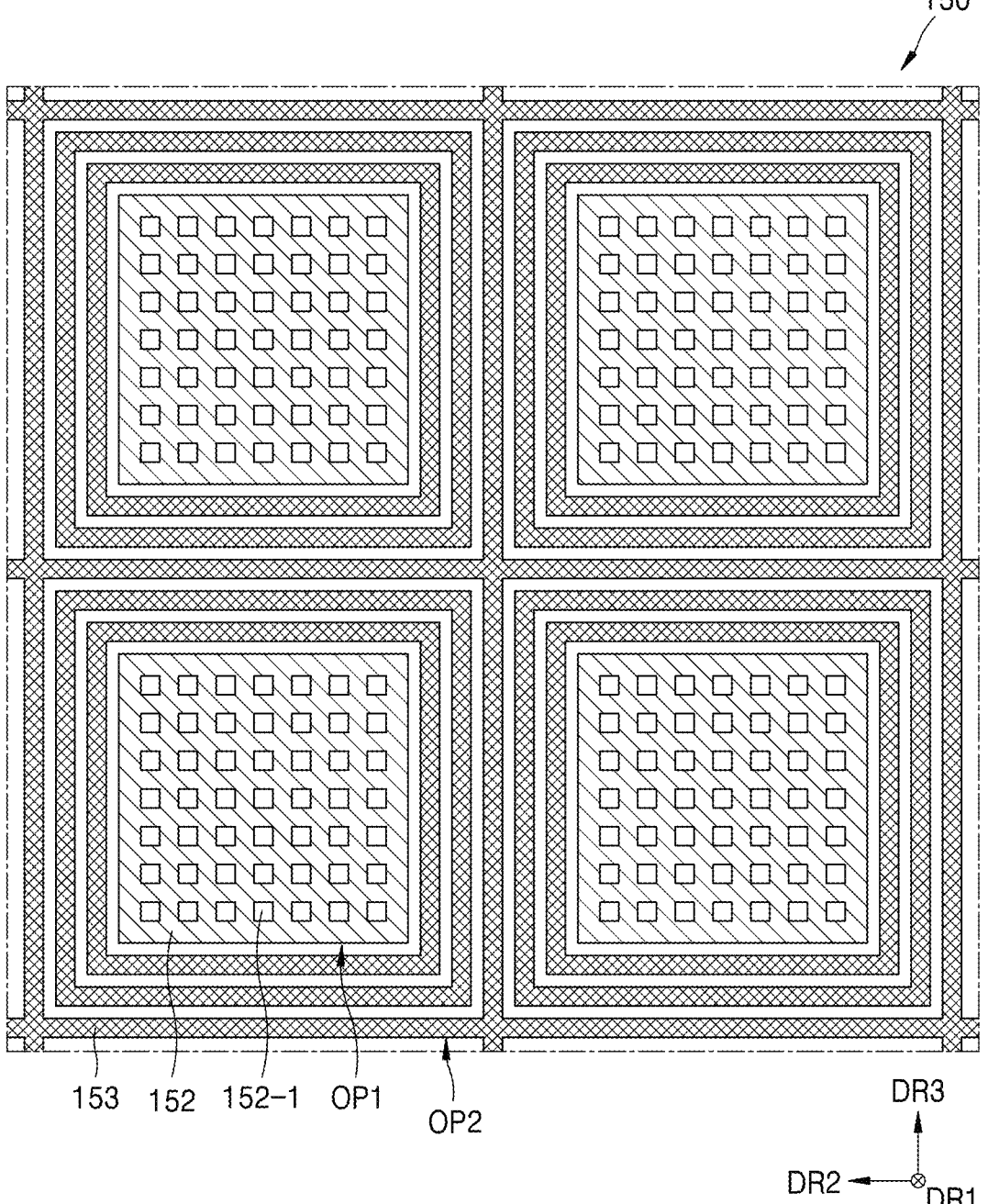
FIG. 7 is a bottom view of a mask assembly according to another embodiment.

FIG. 5 is a bottom view of the mask assembly 150 according to an embodiment. FIG. 6 is a bottom view of the mask assembly 150 according to another embodiment. FIG. 7 is a bottom view of the mask assembly 150 according to another embodiment.

Referring to FIG. 5, in an embodiment, the second opening OP2 may be a slot extending in one direction. In such an embodiment, the second openings OP2 may be apart from each other in a direction (e.g., a perpendicular direction) different from the above direction.

In an embodiment, as shown in FIG. 5, the second openings OP2 may each extend in the third direction DR3 and may be apart from each other in the second direction DR2 in a plan view. In such an embodiment, the second openings OP2 may be arranged between two first openings OP1 apart from each other in the second direction DR2.

In another embodiment, the second openings OP2 may each extend in the second direction DR2 and may be apart from each other in the third direction DR3. In such an embodiment, the second openings OP2 may be arranged between two first openings OP1 apart from each other in the third direction DR3.

In another embodiment, some of the second openings OP2 may extend in the second direction DR2 and may be apart from each other in the third direction DR3, and the others may extend in the third direction DR3 and may be apart from each other in the second direction DR2.

In an embodiment, the second openings OP2 may be parallel to each other. In an embodiment, the support member 153 may be arranged in each second opening OP2.

Referring to FIG. 6, in a similar manner to the embodiment shown in FIG. 5, the second opening OP2 may extend in one direction in a plan view. However, in the embodiment shown in FIG. 6, the second opening OP2 may be a trench further extending in one direction and passing by a plurality of first openings OP1 in the direction of extension.

In an embodiment, the second openings OP2 may extend in the third direction DR3 and may be apart from each other in the second direction DR2. In such an embodiment, the second opening OP2 may extend beyond an edge of an adjacent first opening OP1 on a third direction DR3 side to the neighborhood of another first opening OP1. In other words, a length of the second opening OP2 in the third direction DR3 may be greater than a length of the first opening OP1 in the third direction DR3. Accordingly, the second openings OP2 may pass between first openings OP1 apart from each other in the second direction DR2 and may also pass between other first openings OP1 positioned in the third direction DR3 of the first openings OP1.

In another embodiment, the second openings OP2 may extend in the second direction DR2 and may be apart from each other in the third direction DR3. In such an embodiment, the second opening OP2 may extend beyond an edge of an adjacent first opening OP1 on a second direction DR2 side to the neighborhood of another first opening OP1. In other words, a length of the second opening OP2 in the second direction DR2 may be greater than a length of the first opening OP1 in the second direction DR2. Accordingly, the second openings OP2 may pass between first openings OP1 apart from each other in the third direction DR3 and may also pass between other first openings OP1 positioned in the second direction DR2 of the first openings OP1.

In another embodiment, trench-shaped second openings OP2 extending in the third direction DR3 and trench-shaped second openings OP2 extending in the second direction DR2 may be arranged to cross each other.

Referring to FIG. 7, in an embodiment, the second openings OP2 may have a net or mesh shape at least partially surrounding each of the first openings OP1 in a plan view.

In an embodiment, the second opening OP2 closest to the first opening OP1 may have a frame shape at least partially (e.g., completely) surrounding the first opening OP1. In an embodiment, the inside of the frame shape of the second opening OP2 may have the same shape as that of the first opening OP1 but may be larger than the first opening OP1. In an embodiment, for example, the inside of the frame shape of the second opening OP2 may have a square shape like the first opening OP1 and may be larger than the first opening OP1. Similarly, another second opening OP2 surrounding the second opening OP2 closest to the first opening OP1 may have a larger frame shape than the second opening OP2 closest to the first opening OP1.

In an embodiment, the second opening OP2 arranged in the middle between the first openings OP1 may have a net or mesh shape in which a plurality of frames are put together or combined with each other. In such an embodiment, the second openings OP2 may have a net shape in which a plurality of frames are arranged in one of the holes in a net having several holes.

Figure 8:
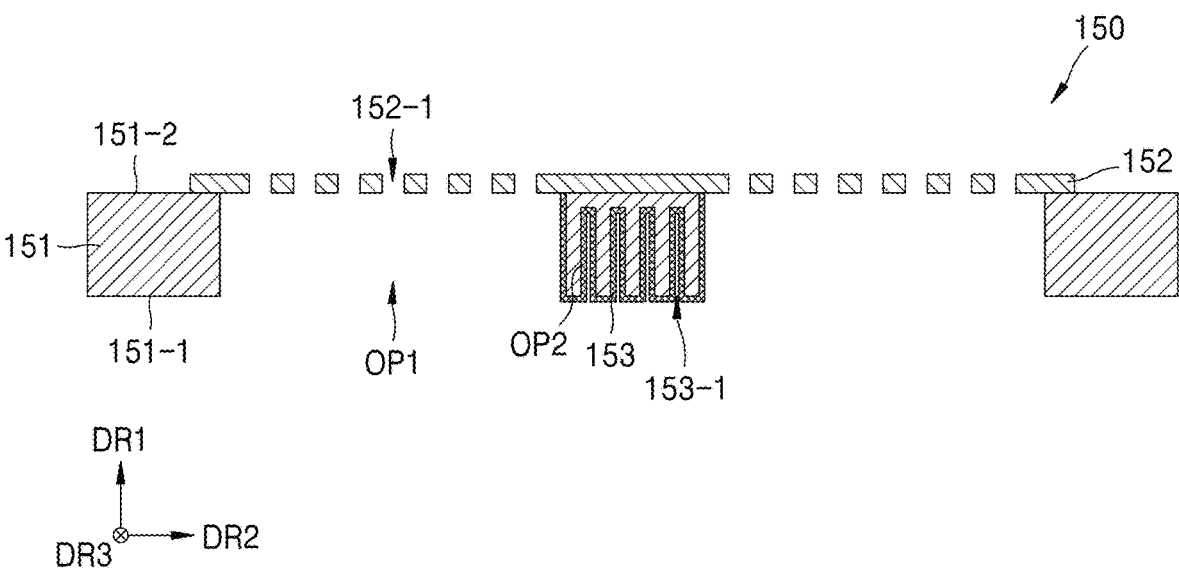
FIG. 8 is a cross-sectional view of a portion of a mask assembly according to an embodiment.
Figure 9:
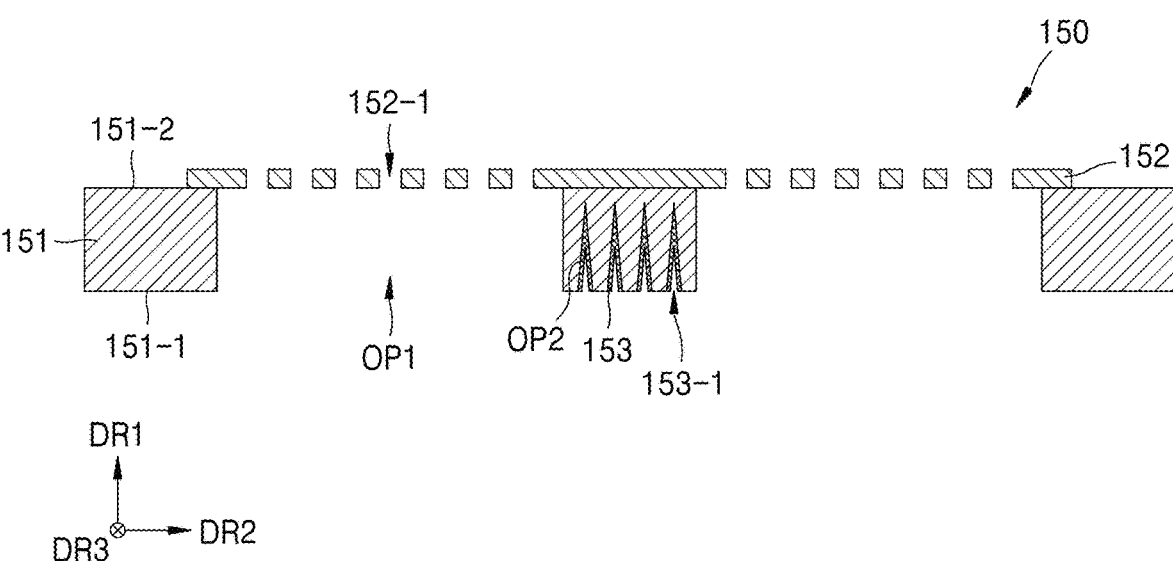
FIG. 9 is a cross-sectional view of a portion of a mask assembly according to another embodiment.
Figure 10:
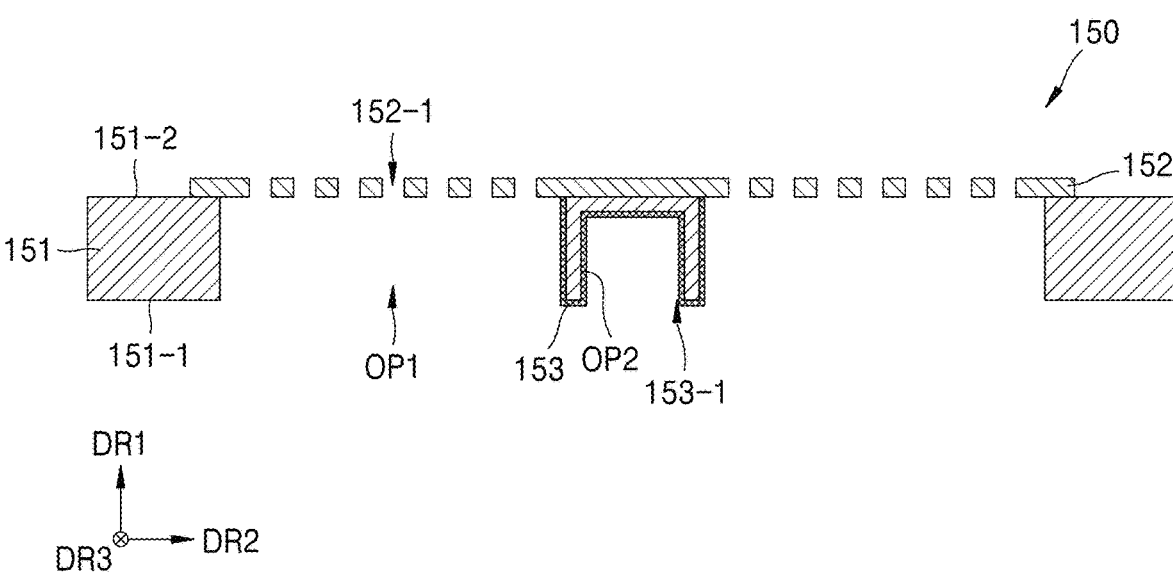
FIG. 10 is a cross-sectional view of a portion of a mask assembly according to another embodiment.
Figure 11:
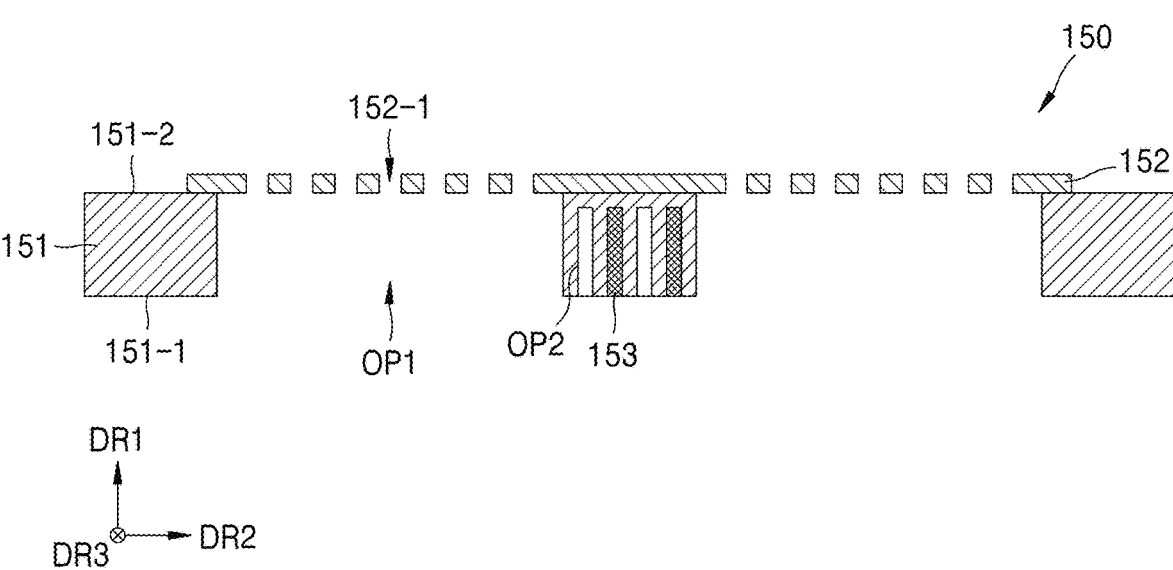
FIG. 11 is a cross-sectional view of a portion of a mask assembly according to another embodiment.
Figure 12:
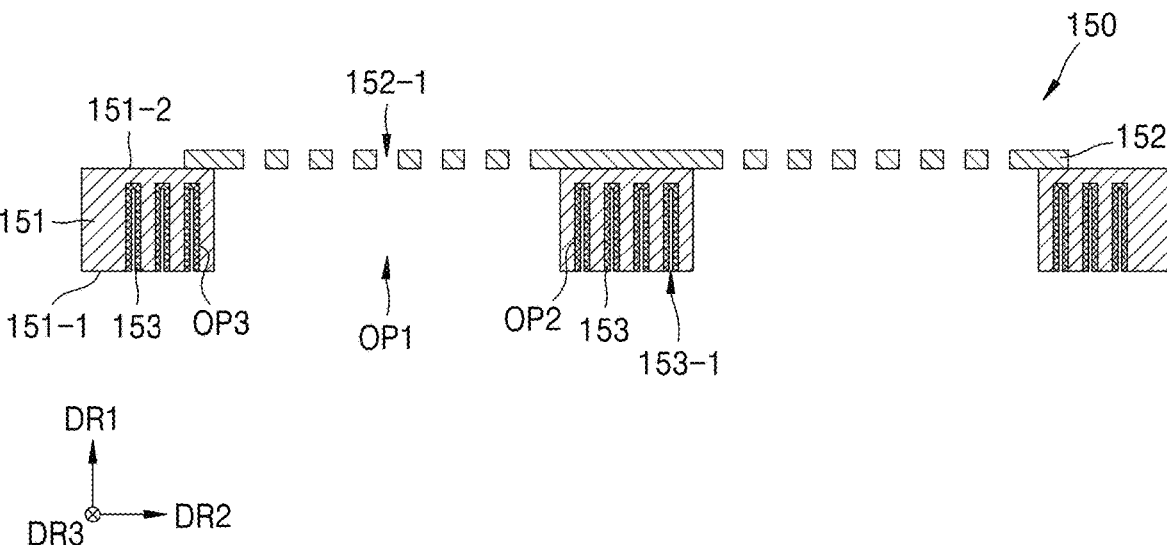
FIG. 12 is a cross-sectional view of a portion of a mask assembly according to another embodiment.

FIG. 8 is a cross-sectional view of a portion of the mask assembly 150 according to an embodiment. FIG. 9 is a cross-sectional view of a portion of the mask assembly 150 according to another embodiment. FIG. 10 is a cross-sectional view of a portion of the mask assembly 150 according to another embodiment. FIG. 11 is a cross-sectional view of a portion of the mask assembly 150 according to another embodiment. FIG. 12 is a cross-sectional view of a portion of the mask assembly 150 according to another embodiment.

Referring to FIG. 8, in an embodiment, the support member 153 may entirely cover a portion of the mask frame 151 provided with the second opening OP2.

In an embodiment, for example, the support member 153 may cover a portion of a surface of the mask frame 151 that faces the second direction DR2 and the opposite direction and a direction opposite to the first direction DR1. In an embodiment, the support member 153 may cover an inner surface of the mask frame 151 that defines the second opening OP2. In addition, the support member 153 may cover a surface of the mask frame 151 that is adjacent to the second opening OP2 and faces the direction opposite to the first direction DR1. In addition, the support member 153 may cover a portion of an inner surface of the mask frame 151 defining the first opening OP1. Accordingly, in such an embodiment, a portion of the support member 153 may be arranged in the first opening OP1. In an embodiment, the support member 153 may be in direct contact with the mask membrane 152 in the first opening OP1. In an embodiment, the support member 153 may include the groove 153-1 overlapping the second opening OP2. In another embodiment, unlike that shown in FIG. 8, the support member 153 may completely fill in the second opening OP2 without including the groove 153-1.

Referring to FIG. 9, in an embodiment, a width (or a length in the second direction DR2) of the second opening OP2 may change in the first direction DR1.

In an embodiment, for example, as shown in FIG. 9, a width (or a length in the second direction DR2) of the second opening OP2 may decrease in the first direction DR1. Accordingly, a width (or a length in the second direction DR2) of a portion of the second opening OP2 that is open toward the first surface 151-1 of the mask frame 151 may be greater than a width (or a length in the second direction DR2) of a portion of the second opening OP2 that is adjacent to the mask membrane 152. In an embodiment, a cross-section of the second opening OP2 may have a substantially triangular shape. In an embodiment, a cross-section of the second opening OP2 may have a substantially trapezoidal shape. In an embodiment, a width (or a length in the second direction DR2) of the second opening OP2 may increase in the first direction DR1. In this case, a width (or a length in the second direction DR2) of a portion of the second opening OP2 that is open toward the first surface 151-1 of the mask frame 151 may be less than a width (or a length in the second direction DR2) of a portion of the second opening OP2 that is adjacent to the mask membrane 152.

Referring to FIG. 10, in an embodiment, a single second opening OP2 may be defined between two first openings OP1 adjacent to each other.

In an embodiment, the second opening OP2 may be formed in the overall area of the mask frame 151. In an embodiment, for example, a width of the second opening OP2 may be about a half of a width of a portion of the mask frame 151 between the first openings OP1 or greater. In an embodiment, the second opening OP2 may simultaneously overlap mask membranes 152 positioned on both sides thereof. In an embodiment, the support member 153 may be disposed on a surface of the mask frame 151 that defines the second opening OP2, a surface of the mask frame 151 that defines the first opening OP1, and a surface of the mask frame 151 that faces a direction opposite to the first direction DR1. In another embodiment, the support member 153 may be disposed on only a surface of the mask frame 151 that defines the second opening OP2. In an embodiment, the groove 153-1 in the support member 153 may also simultaneously overlap the mask membranes 152 positioned on both sides thereof.

Referring to FIG. 11, in an embodiment, the support member 153 may completely fill in the second opening OP2.

In an embodiment, the support member 153 may not include a groove overlapping the second opening OP2 and may completely fill in the second opening OP2. In such an embodiment, a surface of the support member 153 that faces a direction opposite to the first direction DR1 and the first surface 151-1 of the mask frame 151 may be in the same plane.

Referring to FIG. 12, in an embodiment, the mask frame 151 may further include third openings OP3, and a portion of the support member 153 may be arranged in a third opening OP3.

In an embodiment, the mask frame 151 may further include the third openings OP3 adjacent to the first opening OP1. The third opening OP3 may be arranged outside an outermost first opening OP1. Referring to FIG. 2 together, the third opening OP3 may be arranged farther out than the outermost first opening OP1 among the first openings OP1. In an embodiment, for example, the third opening OP3 may be arranged at a second direction DR2 side of the first opening OP1 farthest out in the second direction DR2 among the first openings OP1. The third opening OP3 may be different from the second opening OP2 only in the arrangement position, and other features thereof may be substantially the same as those of the second opening OP2. In other words, among non-penetrating openings in the mask frame 151, the one positioned between the first openings OP1 may be understood as the second opening OP2, and the one positioned outside the first openings OP1 may be understood as the third opening OP3. The support member 153 may be arranged in the third opening OP3 in substantially the same manner as that being arranged in the second opening OP2.

It will be apparent to those of ordinary skill in the art that features of the embodiments described above with reference to FIGS. 8 to 12 may be combined with or modified based on each other.

In addition, it will be apparent to those of ordinary skill in the art that the embodiments (plan views) shown in FIGS. 3A and 4A, the embodiments (bottom views) shown in FIGS. 5 to 7, and the embodiments (cross-sectional views) shown in FIGS. 3B, 4B, and 8 to 12 may be variously combined with or modified based on each other.

FIGS. 13A to 13E are cross-sectional views showing operations in a process of manufacturing a mask assembly, according to an embodiment. Particularly, FIGS. 13A to 13E are cross-sectional views showing operations in a process of manufacturing a mask assembly according to the embodiment shown in FIG. 3B.

Figure 13A:
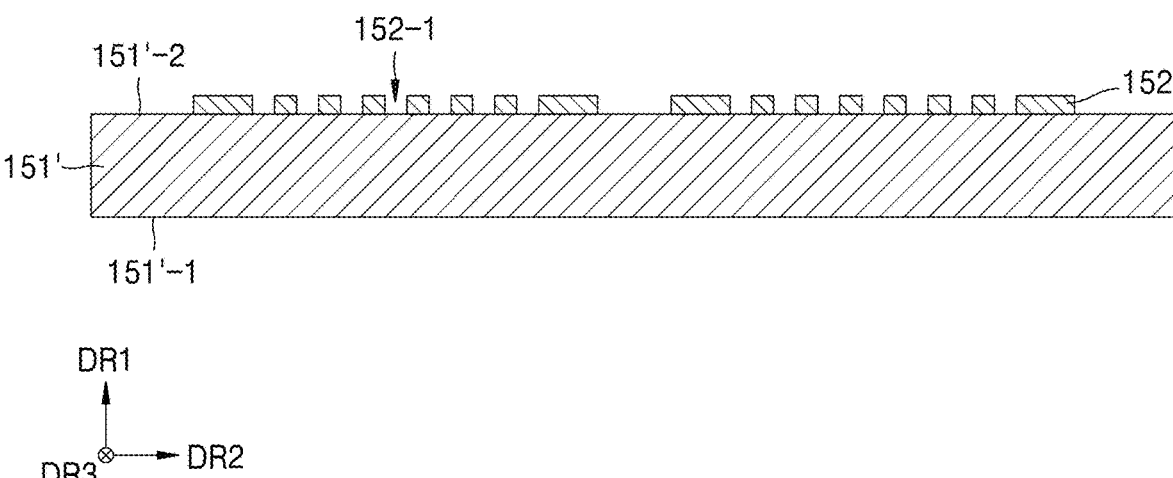
FIGS. 13A to 13E are cross-sectional views showing operations in a process of manufacturing a mask assembly, according to an embodiment.

Referring to FIG. 13A, the mask membrane 152 may be disposed on a frame base material 151'. The frame base material 151' may include a second surface 151'-2 facing the first direction DR1 and a first surface 151'-1 facing a direction opposite to the first direction DR1. The mask membrane 152 may be disposed on the second surface 151'-2 of the frame base material 151'. The mask membrane 152 may be provided with a plurality of holes 152-1.

Figure 13B:
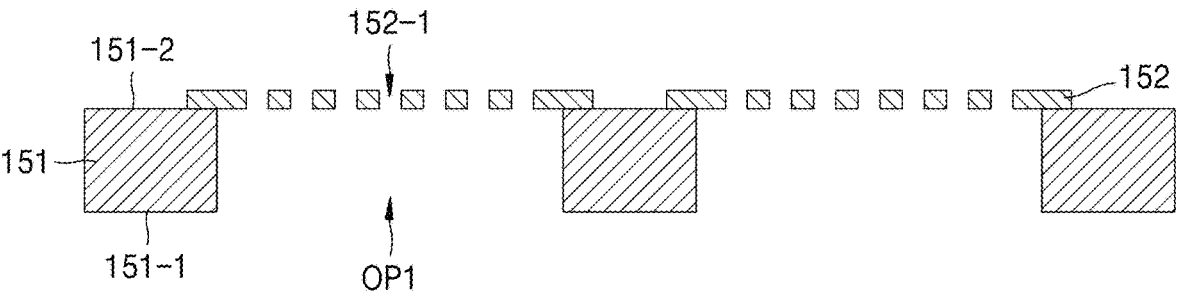

Referring to FIGS. 13A and 13B, the first opening OP1 may be formed by etching a portion of the frame base material 151'. In an embodiment, for example, the first opening OP1 may be formed by etching a portion of the first surface 151'-1 of the frame base material 151'. The frame base material 151' with the first opening OP1 formed therein may be understood as the mask frame 151. In an embodiment, the frame base material 151' may be etched in a way such that the first opening OP1 overlaps the hole 152-1 in the mask membrane 152 and is formed through the frame base material 151'. In an embodiment, the etching process may include dry etching.

Figure 13C:
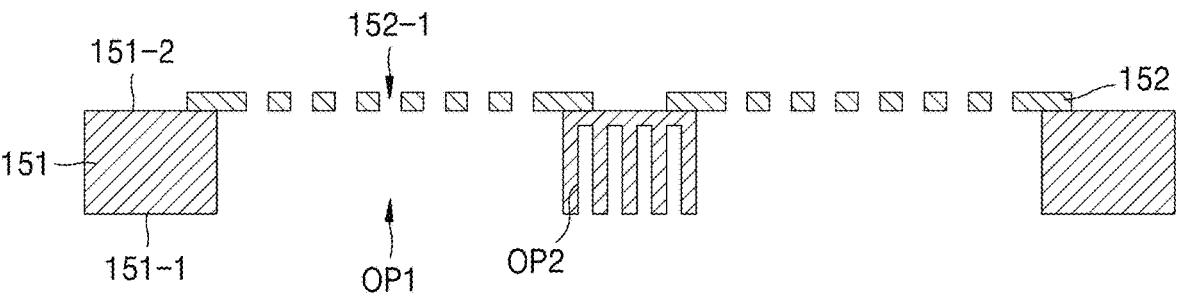

Referring to FIG. 13C, the second openings OP2 may be formed by etching a portion of the mask frame 151 between the first openings OP1. In an embodiment, the process of forming the second openings OP2 may include dry etching.

Figure 13D:
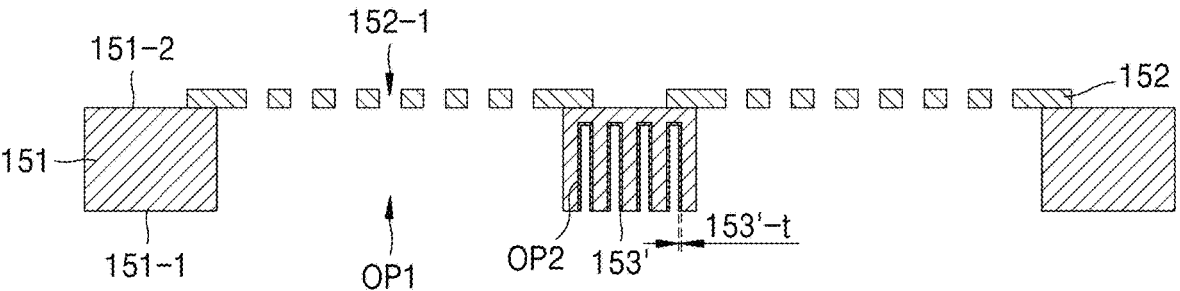

Referring to FIG. 13D, a thin-film layer 153' may be formed in the second opening OP2 first. In an embodiment, the thin-film layer 153' may be understood as an operation before formation of the support member 153 (refer to FIG. 13E). In an embodiment, the thin-film layer 153' may include a same material as that of the support member 153 (refer to FIG. 13E). In an embodiment, a thickness 153'-t of the thin-film layer 153' may be about 10 angstroms (Å) or greater. In an embodiment, the process of forming the thin-film layer 153' may include a deposition process.

Figure 13E:
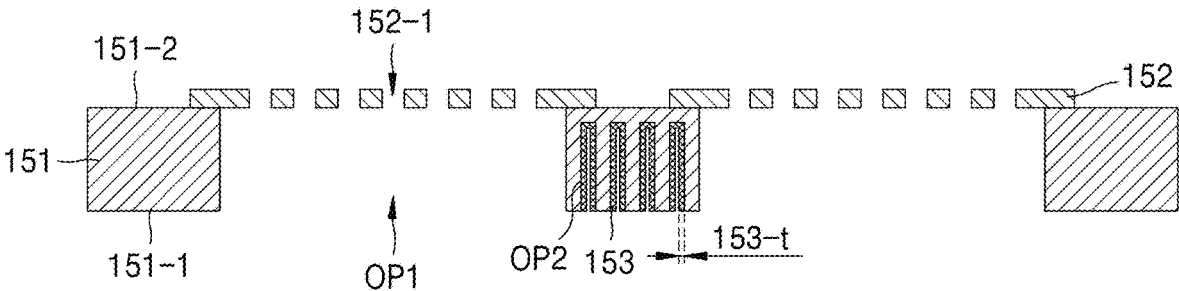

Referring to FIGS. 13D and 13E together, the thin-film layer 153' may be converted into the support member 153. In an embodiment, the thickness 153'-t of the thin-film layer 153' may be less than a thickness 153-t of the support member 153. Accordingly, the support member 153 may be formed by adding the same material onto the thin-film layer 153' to increase a thickness thereof. In an embodiment, the process of forming the support member 153 may include an electroforming process. In another embodiment, the process may be terminated during the operation shown in FIG. 13D, and the formed thin-film layer 153' may be referred to as the support member 153.

Figure 14:
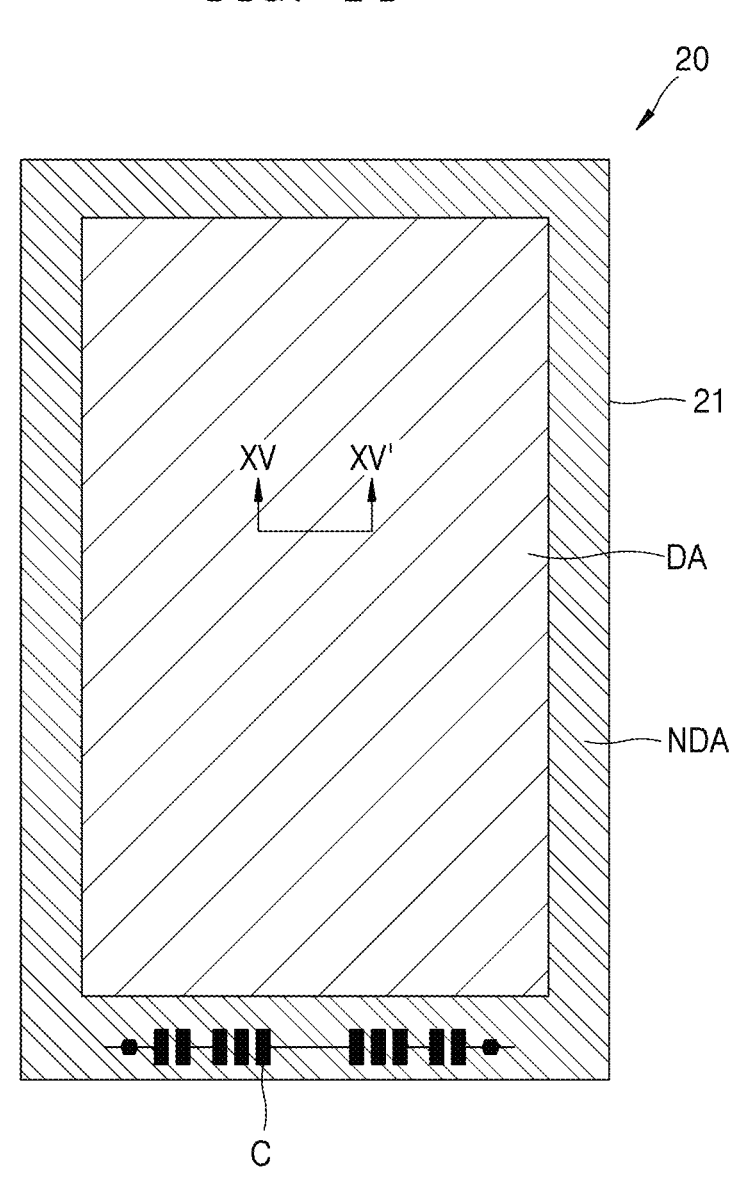
FIG. 14 is a plan view of a display apparatus manufactured by using a device for manufacturing a display apparatus, according to an embodiment.
Figure 15:
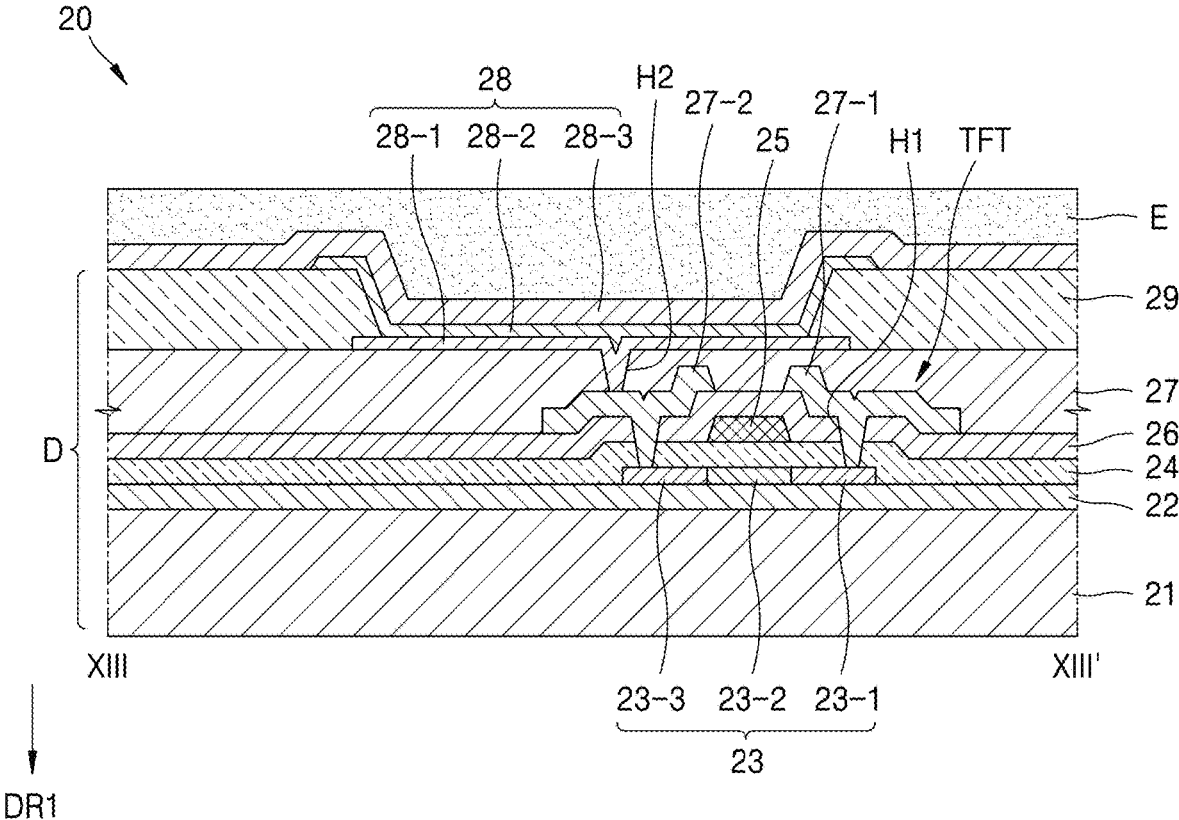
FIG. 15 is a cross-sectional view of the display apparatus, taken along line XV-XV' of FIG. 14.

FIG. 14 is a plan view of the display apparatus 20 manufactured by using a device for manufacturing a display apparatus, according to an embodiment. FIG. 15 is a cross-sectional view of the display apparatus 20, taken along line XV-XV' of FIG. 14.

Referring to FIGS. 14 and 15, an embodiment of the display apparatus 20 may have a display area DA and a non-display area NDA defined on a substrate 21, where the non-display area NDA is arranged around the display area DA. A light-emitting element 28 may be arranged in the display area DA, and power wiring (not shown) may be arranged in the non-display area NDA. In addition, a pad portion C may be arranged in the non-display area NDA.

A plurality of deposition material patterns may be arranged in the display area DA. Although FIG. 14 shows an embodiment where the display apparatus 20 and the display area DA have a substantially quadrangular shape, one or more embodiments are not limited thereto. The display area DA may have another shape, for example, an atypical shape.

The display apparatus 20 may include the display substrate D, an intermediate layer 28-2 disposed on the display substrate D, and an opposite electrode 28-3 disposed on the intermediate layer 28-2. In addition, the display apparatus 20 may include a thin-film encapsulation layer E disposed on the opposite electrode 28-3.

The display substrate D may include the substrate 21, a thin-film transistor TFT, a via layer 27, and a pixel electrode 28-1.

The substrate 21 may include a plastic material or a metal material. In an embodiment, for example, the substrate 21 may include polyimide (PI).

The thin-film transistor TFT may be disposed over the substrate 21, the via layer 27 may cover the thin-film transistor TFT, and the light-emitting element 28 may be disposed on the via layer 27.

A buffer layer 22 including an organic compound and/or an inorganic compound may be further disposed on the substrate 21, and the buffer layer 22 may include $SiO_x$ ($x \geq 1$) and/or $SiN_x$ ($x \geq 1$).

After an active layer 23 arranged in a certain pattern is disposed on the buffer layer 22, the active layer 23 may be buried by a gate insulating layer 24. The active layer 23 may include a source region 23-1 and a drain region 23-3 and may further include a channel region 23-2 therebetween.

The active layer 23 may include at least one selected from various materials. In an embodiment, the active layer 23 may include an inorganic semiconductor material such as amorphous silicon or crystalline silicon. In another embodiment, the active layer 23 may include an oxide semiconductor. In another embodiment, the active layer 23 may include an organic semiconductor material. Hereinafter, embodiments where the active layer 23 is formed of amorphous silicon will be mainly described below for convenience of description.

The active layer 23 may be formed by forming an amorphous silicon layer on the buffer layer 22, crystallizing the amorphous silicon layer into a polycrystalline silicon layer, and patterning the polycrystalline silicon layer. The active layer 23 may have the source region 23-1 and the drain region 23-3 doped with impurities depending on the type of a thin-film transistor such as a driving thin-film transistor (not shown), a switching thin-film transistor (not shown), etc.

A gate electrode 25 corresponding to the active layer 23 and an interlayer insulating layer 26 covering the gate electrode 25 may be disposed on the gate insulating layer 24. After a contact hole H1 is formed in the interlayer insulating layer 26 and the gate insulating layer 24, a source electrode 27-1 and a drain electrode 27-2 may be disposed on the interlayer insulating layer 26 to be in contact with the source region 23-1 and the drain region 23-3, respectively.

The via layer 27 is disposed over the thin-film transistor TFT, and the pixel electrode 28-1 of the light-emitting element 28 is disposed on the via layer 27. The pixel electrode 28-1 is in contact with the drain electrode 27-2 of the thin-film transistor TFT through a via hole H2 in the via layer 27. The via layer 27 may be formed of an inorganic material and/or an organic material in a single layer or two or more layers, and may be a planarization layer having a flat upper surface regardless of curves in a lower layer thereof or may be curved along curves in a lower layer thereof.

After the pixel electrode 28-1 is disposed on the via layer 27, a pixel-defining layer 29 may be formed of an organic material and/or an inorganic material to cover the pixel electrode 28-1 and the via layer 27 and may be provided with an opening to expose the pixel electrode 28-1.

The intermediate layer 28-2 and the opposite electrode 28-3 are disposed on the pixel electrode 28-1. In an embodiment, the opposite electrode 28-3 may be disposed over the entire surface of the display substrate D. In such an embodiment, the opposite electrode 28-3 may be disposed on the intermediate layer 28-2 and the pixel-defining layer 29. Hereinafter, embodiments where the opposite electrode 28-3 is disposed on the intermediate layer 28-2 and the pixel-defining layer 29 will be mainly described for convenience of description.

The pixel electrode 28-1 may serve as an anode, and the opposite electrode 28-3 may serve as a cathode, or the pixel electrode 28-1 may serve as a cathode, and the opposite electrode 28-3 may serve as an anode.

The pixel electrode 28-1 and the opposite electrode 28-3 are insulated from each other by the intermediate layer 28-2, and voltages of different polarities are applied to the intermediate layer 28-2 to cause light emission from the organic emission layer.

The intermediate layer 28-2 may include an organic emission layer. In an embodiment, for example, the intermediate layer 28-2 may include an organic emission layer, and in addition, may further include at least one selected from a hole injection layer, a hole transport layer, an electron transport layer, and an electron injection layer. The disclosure is not limited thereto, and the intermediate layer 28-2 may include an organic emission layer and may further include a variety of other functional layers (not shown).

In an embodiment, the intermediate layer 28-2 may be formed through the above-described device for manufacturing a display apparatus. The intermediate layer 28-2 may be provided in plural, and a plurality of intermediate layers 28-2 may form the display area DA. In such an embodiment, the plurality of intermediate layers 28-2 may be apart from each other in the display area DA.

One unit pixel is defined by or made up of a plurality of sub-pixels, and the plurality of sub-pixels may emit light of various colors. In an embodiment, for example, the plurality of sub-pixels may include sub-pixels that emit red light, green light, and blue light, respectively, and may include sub-pixels (not denoted) that emit red light, green light, blue light, and white light.

The sub-pixel described above may include one intermediate layer 28-2. In an embodiment, when one sub-pixel is formed, the intermediate layer 28-2 may be formed through the above-described device for manufacturing a display apparatus.

The thin-film encapsulation layer E may include a plurality of inorganic layers or may include an inorganic layer and an organic layer. The organic layer of the thin-film encapsulation layer E may be formed of a polymer, and more particularly, may be a single layer or a laminated layer formed of at least one selected from polyethylene terephthalate, polyimide, polycarbonate, epoxy, polyethylene, and polyacrylate. The inorganic layer of the thin-film encapsulation layer E may be a single layer or a laminated layer including a metal oxide or a metal nitride. In an embodiment, for example, the inorganic layer may include one of $SiN_x$, $Al_2O_3$, $SiO_x$, and $TiO_2$. An externally exposed top layer of the thin-film encapsulation layer E may be an inorganic layer for preventing penetration of moisture into a light-emitting element.

The thin-film encapsulation layer E may have at least one sandwich structure with at least one organic layer between at least two inorganic layers. In an embodiment, for example, the thin-film encapsulation layer E may have at least one sandwich structure with at least one inorganic layer between at least two organic layers. In an embodiment, for example, the thin-film encapsulation layer E may have a sandwich structure with at least one organic layer between at least two inorganic layers and a sandwich structure with at least one inorganic layer between at least two organic layers.

According to embodiments of the disclosure, as described above, a device for manufacturing a display apparatus, in which a mask and a substrate may be brought into close contact with each other by applying a magnetic force to a mask assembly including a magnetic body without using a separate metal support member, may be provided. In such embodiments, because a main body of the mask assembly does not have to be made out of a metal, a more precise pattern may be realized by making a mask membrane and/or a mask frame out of silicon. Accordingly, a display apparatus with higher resolution may be manufactured.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A device for manufacturing a display apparatus, the device comprising:

a mask assembly; and a magnetic force portion facing the mask assembly, wherein the magnetic force portion applies a magnetic force toward the mask assembly, wherein the mask assembly comprises:

a mask frame in which a plurality of first openings is defined therethrough in a thickness direction and a second opening is defined in a first surface thereof in a recess or groove form, wherein the second opening is arranged between two adjacent first openings among the plurality of first openings;

a mask membrane disposed on a second surface of the mask frame, which is opposite to the first surface, and overlapping at least one of the plurality of first openings; and a support member disposed on the first surface of the mask frame and comprising a magnetic body, wherein the support member is disposed on at least one selected from a surface of the mask frame defining a first opening and a surface of the mask frame defining the second opening.

2. The device of claim 1, wherein a depth of the second opening is less than a thickness of the mask frame.

3. The device of claim 1, wherein the support member defines a groove overlapping the second opening.

4. The device of claim 1, wherein a width of the second opening changes in a depth direction of the second opening.

5. The device of claim 1, wherein a width of the second opening is about a half of a distance between the two adjacent first openings or greater.

6. The device of claim 1, wherein the support member completely fills in the second opening.

7. The device of claim 1, wherein a third opening is defined in the first surface of the mask frame, wherein the third opening is arranged outside the plurality of first openings, wherein a portion of the support member is arranged in the third opening.

8. The device of claim 1, wherein the second opening is provided in plural, wherein a plurality of second openings are apart from each other and arranged between the two adjacent first openings among the plurality of first openings.

9. The device of claim 1, wherein, in a plan view, the second opening at least partially surrounds one of the plurality of first openings.

10. The device of claim 1, wherein a thickness of the support member is about 10 angstroms or greater.

* * * * *